(12) United States Patent
Sunamura et al.

(10) Patent No.: US 8,664,769 B2
(45) Date of Patent: Mar. 4, 2014

(54) SEMICONDUCTOR DEVICE

(75) Inventors: Hiroshi Sunamura, Kanagawa (JP); Naoya Inoue, Kanagawa (JP); Kishou Kaneko, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/552,034

(22) Filed: Jul. 18, 2012

(65) Prior Publication Data

US 2013/0037795 A1 Feb. 14, 2013

(30) Foreign Application Priority Data

Aug. 10, 2011 (JP) ................. 2011-175391

(51) Int. Cl.
*H01L 23/52* (2006.01)
*H01L 29/12* (2006.01)

(52) U.S. Cl.
USPC .... 257/776; 257/43; 257/E27.06; 257/E21.19

(58) Field of Classification Search
CPC ...... H01L 29/7869; H01L 21/16; H01L 21/00
USPC ......... 257/43, E27.06, E21.19, 734, 776, 784
See application file for complete search history.

(56) References Cited

U.S. PATENT DOCUMENTS

2005/0275038 A1* 12/2005 Shih et al. .................... 257/382
2010/0148171 A1 6/2010 Hayashi et al.

FOREIGN PATENT DOCUMENTS

JP 2010-141230 6/2010

\* cited by examiner

*Primary Examiner* — Nikolay Yushin
(74) *Attorney, Agent, or Firm* — Young & Thompson

(57) ABSTRACT

An element using a semiconductor layer is formed between wiring layers and, at the same time, a gate electrode is formed using a conductive material other than a material for wirings. A first wiring is embedded in a surface of a first wiring layer. A gate electrode is formed over the first wiring. The gate electrode is coupled to the first wiring. The gate electrode is formed by a process different from a process for the first wiring. Therefore, the gate electrode can be formed using a material other than a material for the first wiring. Further, a gate insulating film and a semiconductor layer are formed over the gate electrode.

27 Claims, 40 Drawing Sheets

400, 402, 410

200, 202, 300

SEMICONDUCTOR DEVICE

CROSS-REFERENCE TO RELATED APPLICATIONS

The disclosure of Japanese Patent Application No. 2011-175391 filed on Aug. 10, 2011 including the specification, drawings and abstract is incorporated herein by reference in its entirety.

BACKGROUND

The present invention relates to a semiconductor device in which a semiconductor element is formed in a multi-layer wiring layer and a method for manufacturing the same.

According to Patent Document 1, a semiconductor film is formed in a wiring layer, and a transistor is formed with use of the semiconductor film and wirings of the wiring layer. In the transistor, a wiring located under the semiconductor film is used as a gate electrode, and a diffusion prevention film between wiring layers is used as a gate insulating film.

[Patent Document 1] Japanese Unexamined Patent Publication No. 2010-141230

SUMMARY

One of the properties which a transistor is asked for is a threshold value voltage. The threshold value voltage is controlled by, other than a film thickness of the gate insulating film, materials of a gate electrode and the gate insulating film too. However, according to a technology described in Patent Document 1, the wiring included in the multi-layer wiring layer is used as a gate electrode. Therefore, the material of the gate electrode cannot be changed.

According to the present invention, there is provided a semiconductor device, including: a first wiring layer having a first wiring; a second wiring layer formed over the first wiring layer and having a second wiring; a gate electrode located between the first wiring and the second wiring in a thickness direction, containing a material different from that of the first wiring, and coupled to the first wiring; a gate insulating film located over the gate electrode; a semiconductor layer located over the gate insulating film; and a first via embedded into the second wiring layer and coupling the semiconductor layer with the second wiring.

According to the present invention, an element using a semiconductor layer can be formed between wiring layers. Also, the gate electrode can be formed by a process different from processes for the wirings in the wiring layers. Therefore, the gate electrode can be formed using a conductive material other than a material for the wirings.

According to the present invention, there is provided a method for manufacturing a semiconductor device, including the steps of: forming a first wiring layer having a first wiring over a semiconductor substrate; forming, over the first wiring layer, a gate electrode, a gate insulating film located over the gate electrode, and a semiconductor layer located over the gate insulating film; and forming, over the first wiring layer and over the semiconductor layer, a second wiring layer having a second wiring. The gate electrode is coupled to the first wiring and the second wiring is coupled to the semiconductor layer.

According to the present invention, the element using the semiconductor layer can be formed between wiring layers, and the gate electrode can be formed using a conductive material other than a material for the wirings.

DETAILED DESCRIPTION

Embodiments of the present invention will be described below with reference to the drawings. In all of the drawings, similar signs are numbered to similar component parts and descriptions are arbitrarily omitted.

First Embodiment

Figure 1:
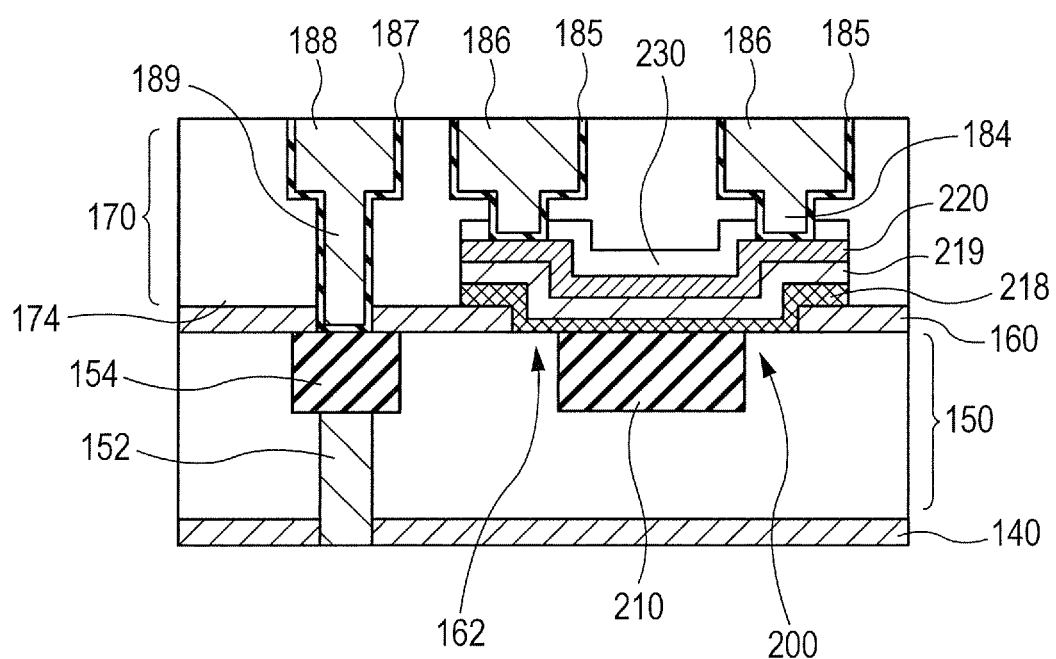
FIG. 1 is a cross-sectional view showing a configuration of a semiconductor device according to a first embodiment.

FIG. 1 is a cross-sectional view showing a configuration of a semiconductor device according a first embodiment. The semiconductor device includes: a first wiring layer 150; a second wiring layer 170; a first wiring 210; a gate electrode 218; a gate insulating film 219; a semiconductor layer 220; a first via 184; and a second wiring 186. The second wiring layer 170 is located over the first wiring layer 150. The first wiring layer 150 and the second wiring layer 170 configure at least part of the multi-layer wiring layer. The multi-layer wiring layer is formed over a semiconductor substrate (not shown in FIG. 1) such as a silicon substrate, for example. Elements such as a transistor, for example, are formed over the semiconductor substrate. The semiconductor substrate and the transistor will be described in another embodiment to be described later.

Each of the insulating film configuring the first wiring layer 150 and the insulating film 174 configuring the second wiring layer 170 is, for example, a low dielectric constant insulating layer having a lower dielectric constant (for example, a relative dielectric constant is 2.7 or lower) than that of silicon oxide. For the low dielectric constant insulating layer, for example, carbon-containing films such as an SiOC film, an SiOCH film, and SILK (registered trademark); an HSQ (hydrogen silsesquioxane) film, an MHSQ (methylated hydrogen silsesquioxane) film, an MSQ (methyl silsesquioxane) film or a porous film thereof can be used.

The first wiring layer 150 is formed over a diffusion prevention film 140. The diffusion prevention film 140 is formed using an insulating material which contains at least two or more elements of Si, C, and N. For example, the diffusion prevention film 140 is an SiN film, an SiCN film, or an SiC film. Alternatively, the diffusion prevention film 140 may be a stacked structure made by stacking two or more of the above films. A thickness of the diffusion prevention film 140 is, for example, 10 nm or more and 150 nm or less.

In a surface of the insulating layer which configures the first wiring layer 150, a third wiring 154, and a first wiring 210 are embedded. The third wiring 154 and the first wiring 210 are formed by the same process. For this reason, the third wiring 154 and the first wiring 210 have the same depth, and are formed using the same material, such as a metal material, for example, containing copper as a principal component (95% or more).

The gate electrode 218 is formed over the first wiring 210. The gate electrode 218 is coupled to the first wiring 210. The gate electrode 218 is formed by a process different from a process for the first wiring 210. Therefore, the gate electrode 218 can be formed using a material other than a material for the first wiring 210. The gate electrode 218 includes, for example, Ti, Ta, W, TiN, TaN, and WN films, a compound containing Co or W, a film made by introducing at least one of C and O to one of the above, or a stacked layer made by stacking two or more kinds of these films.

A gate insulating film 219 is formed over the gate electrode 218. A thickness of the gate insulating film 219 is, for example, 0.5 nm or more and 50 nm or less. The gate insulating film 219 includes, for example, a silicon oxide film, a silicon nitride film, or an oxide film containing at least one of Hf, Zr, Al, Ti, and Ta. In addition, the gate insulating film 219 may be made by adding nitrogen and carbon to the above insulating film or a metal silicate. Also, the gate insulating film 219 may be a stacked layer made by stacking two or more of these films.

A semiconductor layer 220 is formed over the gate insulating film 219. The semiconductor layer 220 is, for example, 10 nm or more and 300 nm or less in thickness. The semiconductor layer 220 has, for example, an oxide semiconductor layer such as an InGaZnO (IGZO) layer, an InZnO layer, a ZnO layer, a ZnAlO layer, a ZnCuO layer, an NiO layer, an SnO layer, an $SnO_2$ layer, a CuO layer, a $Ta_2O_5$ layer, or a $TiO_2$ layer. The semiconductor layer 220 may be a single-layer structure of the above-described oxide semiconductor layer, or may be a stacked structure of the above-described oxide semiconductor layer and other layers. As an example of the latter case, there is a stacked structure of $IGZO/Al_2O_3$/$IGZO/Al_3O_3$. Moreover, the semiconductor layer 220 may be a polysilicon layer or an amorphous silicon layer.

A source and a drain are provided in the semiconductor layer 220. When the semiconductor layer 220 is an oxide semiconductor layer, the source and the drain are formed by, for example, introducing an oxygen defect. However, it may be formed by introducing impurities. Alternatively, it may be formed by modifying the property of the semiconductor layer 220 when forming a contact. When the semiconductor layer 220 is a polysilicon layer or an amorphous silicone layer, the source and the drain are formed by introducing impurities. A width of the source and the drain in a gate width direction (namely, a direction perpendicular to a plane of FIG. 1) is, for example, 50 nm or more and 10 micrometers or less.

Of the semiconductor layer 220, a region sandwiched between the source and the drain becomes a channel region. As seen in a plan view, the channel region is overlapped with the gate electrode 218 and the gate insulating film 219.

A hard mask film 230 is formed over the semiconductor layer 220. The hard mask film 230 is used to allow the semiconductor layer 220 to selectively remain by etching. For this reason, the hard mask film 230 and the semiconductor layer 220 have the same planar shape. A material for the hard mask film 230 may be the one capable of obtaining an etching selection ratio with respect to the semiconductor layer 220.

A fourth wiring 188 and two second wirings 186 are formed in the second wiring layer 170. The fourth wiring 188 is coupled to the third wiring 154 through a via 189, and the two second wirings 186 are coupled to the source/drain of the semiconductor layer 220 through first vias 184, respectively. In a plan view, the first vias 184 are disposed on the opposite sides from each other through the center of the gate electrode 218. Also, the two first vias 184 do not have to be arranged point-symmetrically about the center of the gate electrode 218. For example, the first via 184 to be coupled to the drain of the semiconductor layer 220 may be disposed farther from the gate electrode 218 than the first via 184 to be coupled to the source of the semiconductor layer 220.

The second wiring 186 and the fourth wiring 188 are formed by the same process. Therefore, the second wiring 186 and the fourth wiring 188 are formed using the same material, such as a metal material containing copper as a principal component (95% or more).

According to the example shown in FIG. 1, each wiring and the via have a dual damascene structure. However, the wiring and the via in at least one layer may have a single damascene structure. Moreover, the second wiring layer 170 may have a structure such as an Al wiring which is made by selectively removing a metal film by dry etching. Moreover, in the second wiring layer 170, barrier metal films 185 and 187 are formed over sidewalls of slots or holes into which the wirings and the vias are embedded, respectively. The barrier metal films 185 and 187 includes Ti, Ta, Ru, W, and nitrides or oxides thereof. In addition, each of the barrier metal films 185 and 187 may be a single layer comprised of these materials or a stacked layer made by stacking two or more layers. Examples of the stacked layer include a stacked structure such as TiN (an upper layer)/Ti (a lower layer) or Ta (an upper layer)/TaN (a lower layer).

In the first wiring layer 150 also, barrier metal films may be formed over sidewalls of the slots or holes into which the wirings and the vias are embedded. This barrier metal film also has a configuration similar to that of the barrier metal film in the second wiring layer 170.

In addition, the combination of the material of each wiring and the material of each barrier metal film is not limited to those described above. For example, at least one wiring layer may possibly contain Al.

In the above structure, the gate electrode 218, the gate insulating film 219, and the semiconductor layer 220 configure a transistor 200 (a second transistor). That is, according to the present embodiment, an active element is formed in the multi-layer wiring layer. When the transistor 200 is an N-channel type transistor, the semiconductor layer 220 is an InGaZnO (IGZO) layer, an InZnO layer, a ZnO layer, a ZnAlO layer, a ZnCuO layer, an $SnO_2$ layer, a $Ta_2O_5$ layer, or a $TiO_2$ layer. Moreover, when the transistor 200 is a P-channel type transistor, the semiconductor layer 220 is an $NiO_2$ layer, an SnO layer, a ZnO layer, a ZnAlO layer, a ZnCuO layer, or a CuO layer. Further, when the N-channel type transistor 200 and the P-channel type transistor 200 are formed in the same layer, they may be formed using the same material as that of the semiconductor layer 220 of each transistor 200.

In the present embodiment, the diffusion prevention film 160 is formed between the first wiring layer 150 and the second wiring layer 170. An opening 162 is formed in the diffusion prevention film 160. The gate electrodes 218 are formed over the diffusion prevention films 160 located inside the opening 162 and its periphery. A configuration of the diffusion prevention film 160 is similar to that of the diffusion prevention film 140. Moreover, the gate insulating film 219, the semiconductor layer 220, and the hard mask film 230 also have the same planar shape as that of the gate electrode 218. In the example shown in FIG. 1, the gate electrode 218 is thinner than the diffusion prevention film 160. However, the gate electrode 218 may have the same thickness as that of the diffusion prevention film 160, or may be thicker than the diffusion prevention film 160.

In addition, the hard mask film 230 is, for example, a layer of the same material as that of the diffusion prevention film 160 and having the same thickness as that of the diffusion prevention film 160. However, the hard mask film 230 may be formed using a material which is different from that of the diffusion prevention film 160. Moreover, the hard mask film 230 may be a stacked structure including a layer containing the same material as that of the diffusion prevention film 160 and another layer (for example, an $SiO_2$ layer or an SiOCH layer) stacked thereon in this order. In this case, a thickness of the other layer is, for example, 10 nm or more and 200 nm or less.

Figure 2:
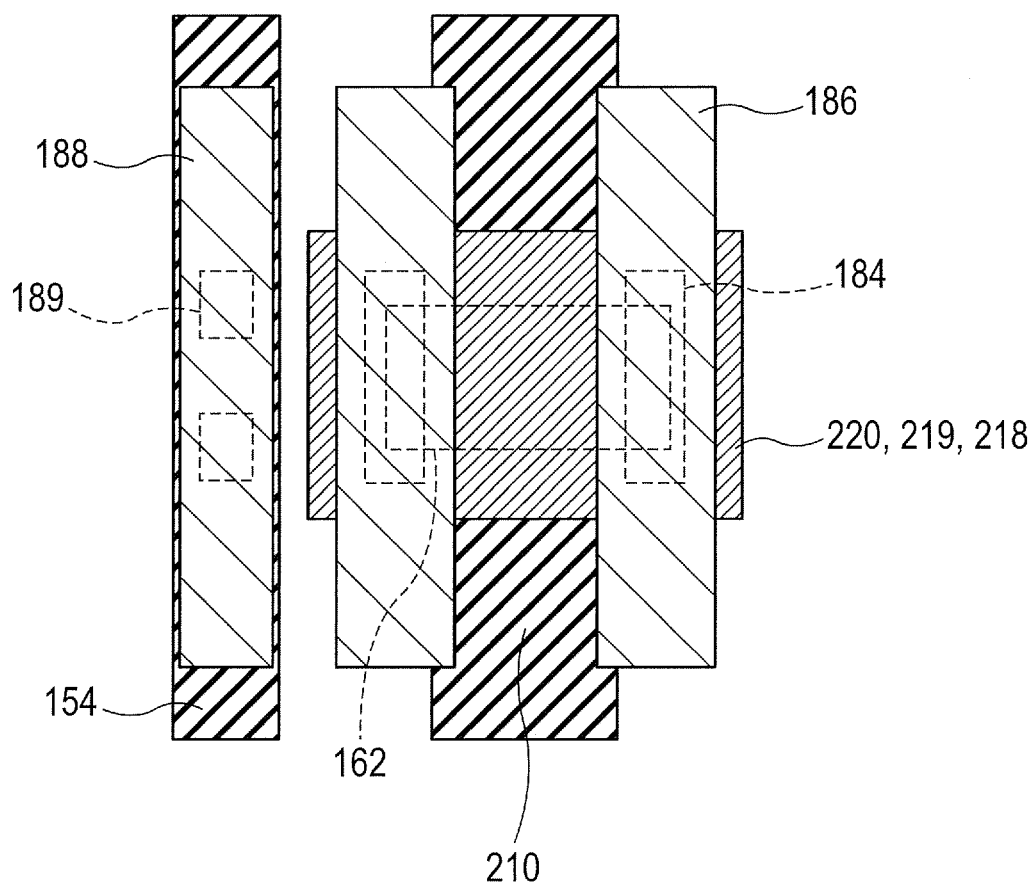
FIG. 2 is a plan view of a transistor shown in FIG. 1.

FIG. 2 is a plan view of the transistor 200 shown in FIG. 1. In an example shown in FIG. 2, of the semiconductor layer 220, a region in which one transistor 200 is formed is rectangular. Two first vias 184 are coupled to the periphery of two short sides of the semiconductor layer 220.

Figure 3A:
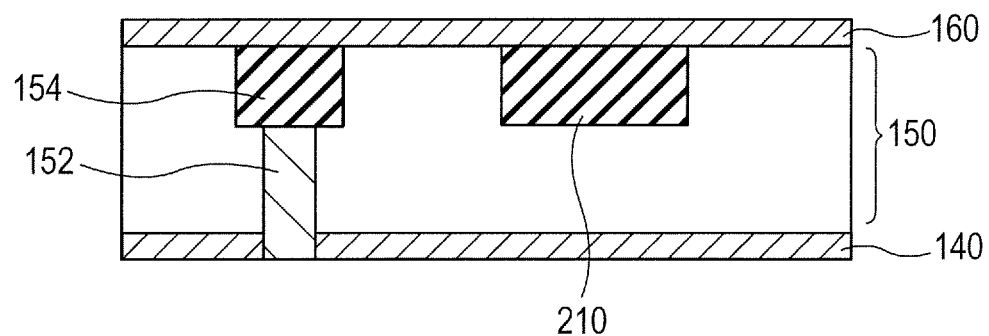
FIGS. 3(a) and 3(b) are cross-sectional views showing a method for manufacturing the semiconductor device of FIG. 1.

FIGS. 3(a) and 3(b) to FIGS. 6(a) and 6(b) are cross-sectional views showing a method for manufacturing the semiconductor device shown in FIG. 1. First, as shown in FIG. 3(a), a transistor etc. are formed over a semiconductor substrate (not shown), and a lower layer wiring layer (not shown) is formed over the semiconductor substrate. Subsequently, a diffusion prevention film 140 is formed over the wiring layer. Subsequently, an insulating film which configures the first wiring layer 150 is formed over the diffusion prevention film 140. Subsequently, a via hole and a wiring slot are formed in the insulating film.

Subsequently, as required, barrier metal films (not shown) are formed over bottom surfaces and sidewalls of the via hole and the wiring slots as well as over the insulating film to be the first wiring layer 150. The barrier metal films are formed by, for example, a sputtering method. Subsequently, in the via hole and the wiring slot as well as over the insulating film which configures the first wiring layer 150, a metal film is formed by, for example, a plating method. Subsequently, the metal film and the barrier metal film over the insulating film which configure the first wiring layer 150 are removed by, for example, a CMP method. Thus, the first wiring layer 150 is formed. A third wiring 154, a via 152, and a first wiring 210 are included in the first wiring layer 150. In addition, although the via 152 and the third wiring 154 may be formed by a single damascene method, they may also be formed by a dual damascene method.

Subsequently, a diffusion prevention film 160 is formed over the first wiring layer 150. The diffusion prevention film 160 is formed by, for example, a CVD method.

Figure 3B:
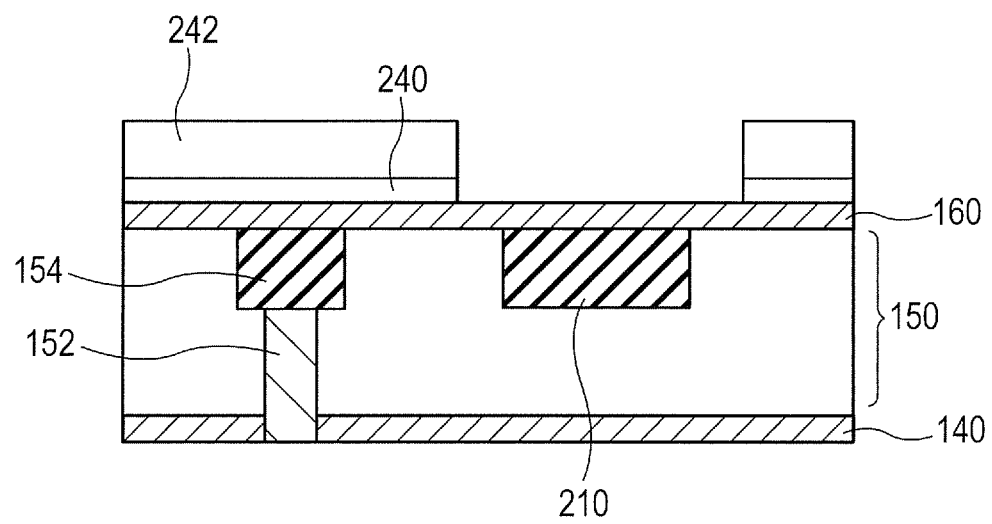

Subsequently, as shown in FIG. 3(b), a hard mask film 240 is formed over the diffusion prevention film 160. Subsequently, a resist pattern 242 is formed over the hard mask film 240. Subsequently, etching of the hard mask film 240 is performed using the resist pattern 242 as a mask. Thus, an opening is formed in the hard mask film 240. Of the diffusion prevention film 160, the opening is located over a region where an opening 162 is formed.

Figure 4A:
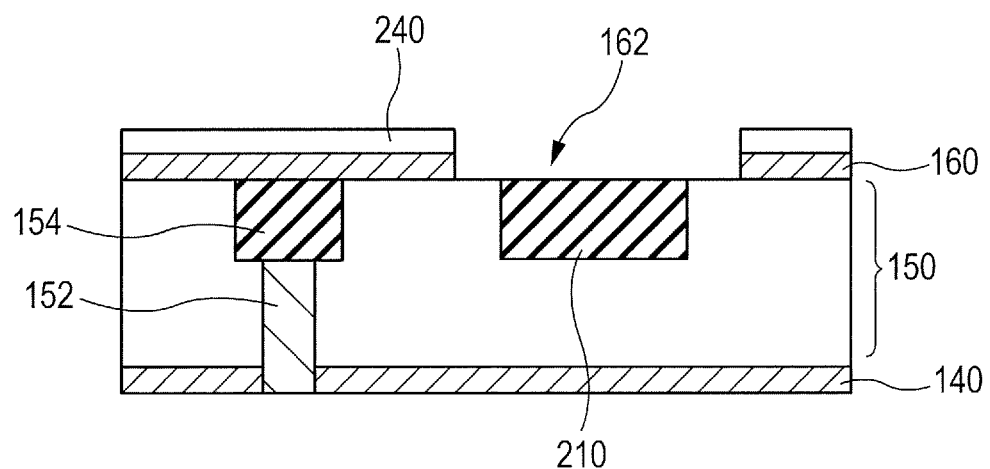
FIGS. 4(a) and 4(b) are cross-sectional view showing the method for manufacturing the semiconductor device of FIG. 1.

Subsequently, as shown in FIG. 4(a), etching of the diffusion prevention film 160 is performed using the hard mask film 240 as a mask. Thus, the opening 162 is formed in the diffusion prevention film 160. At this stage, the first wiring 210 is exposed at the bottom of the opening 162.

Figure 4B:
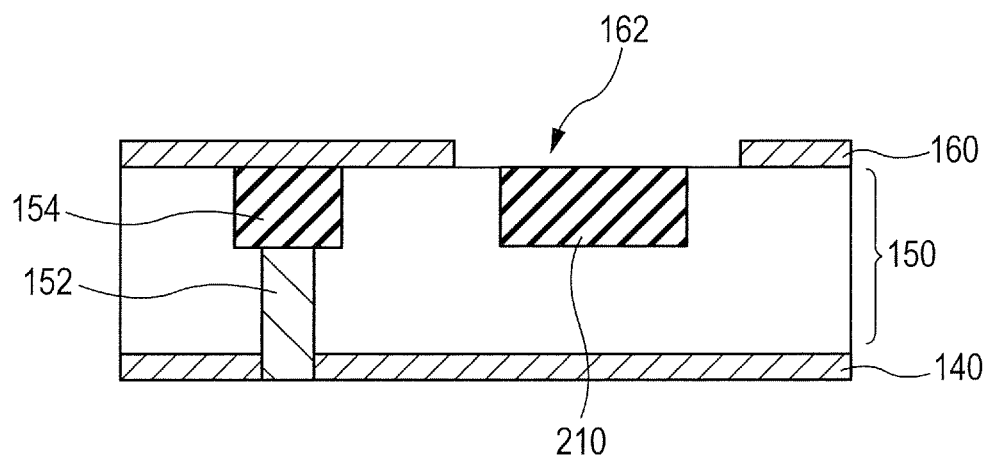

Subsequently, as shown in FIG. 4(b), the hard mask film 240 is removed.

Figure 5A:
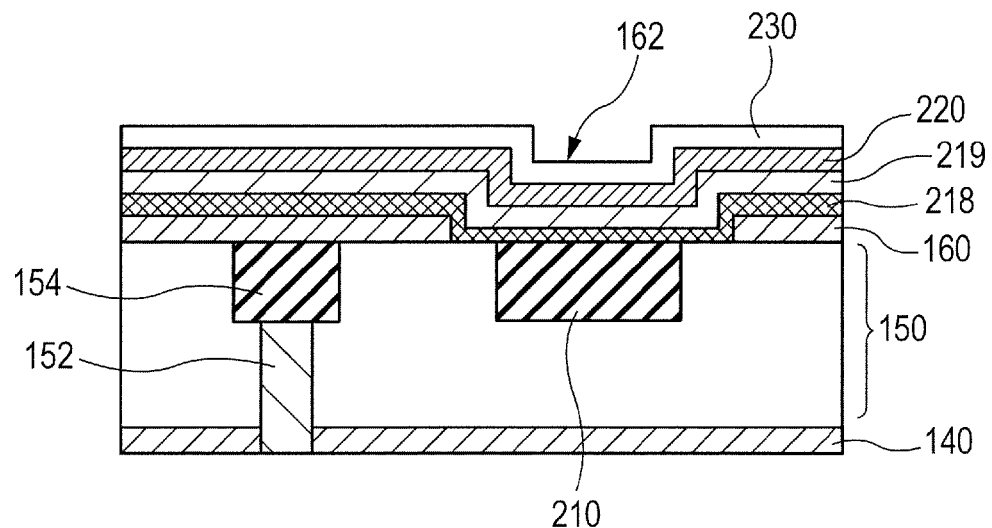
FIGS. 5(a) and 5(b) are cross-sectional views showing the method for manufacturing the semiconductor device of FIG. 1.

Subsequently, as shown in FIG. 5(a), a gate electrode 218 is formed over the first wiring 210 located inside the opening 162 and over the whole surface of the diffusion prevention film 160. Although the gate electrode 218 is formed by, for example, the sputtering method, they may be formed by the CVD method. Subsequently, a gate insulating film 219 is formed over the gate electrode 218. The gate insulating film 219 is formed by, for example, the CVD method or the sputtering method.

Subsequently, a semiconductor layer 220 is formed over the gate insulating film 219. When an oxide semiconductor layer such as an InGaZnO layer, an InZnO layer, a ZnO layer, a ZnAlO layer, a ZnCuO layer, an NiO layer, an SnO layer, or a CuO layer is used in the semiconductor layer 220, the semiconductor layer 220 is formed by, for example, the sputtering method. At this time, the semiconductor substrate is heated at a temperature of 400° C. or lower. Moreover, when the semiconductor layer 220 is a polysilicon layer or an amorphous silicon layer, the semiconductor layer 220 is formed by, for example, a plasma CVD method.

Subsequently, a hard mask film 230 is formed over the semiconductor layer 220. For example, when the hard mask film 230 has the same layer as the diffusion prevention film 160, this layer is formed by the same method as that of the diffusion prevention film 160. Moreover, when the hard mask film 230 further has a silicon oxide layer, the silicon oxide layer is formed by, for example, the CVD method.

Figure 5B:
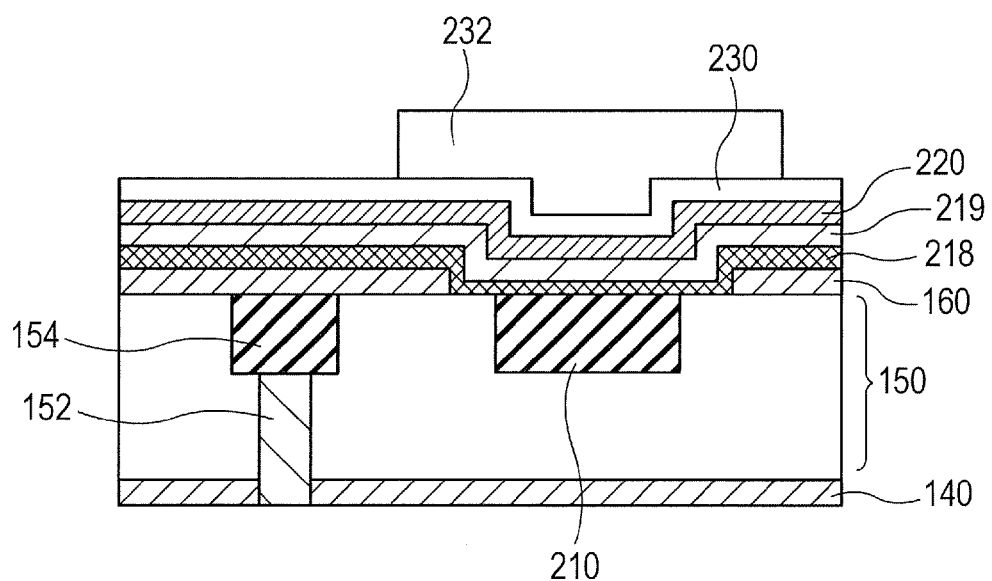

Subsequently, as shown in FIG. 5(b), a resist pattern 232 is formed over the hard mask film 230.

Figure 6A:
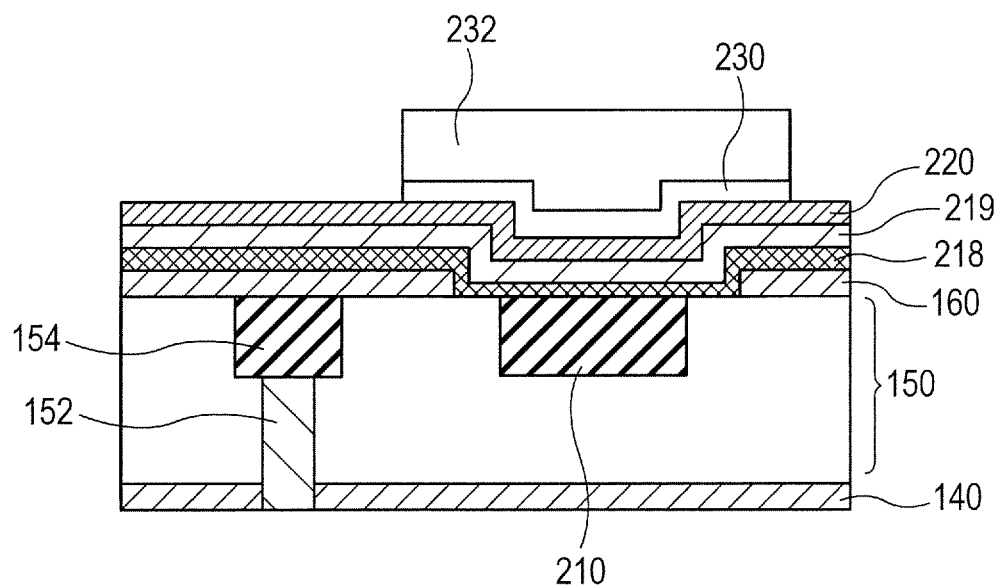
FIGS. 6(a) and 6(b) are cross-sectional views showing the method for manufacturing the semiconductor device of FIG. 1.

Subsequently, as shown in FIG. 6(a), etching of the hard mask film 230 is perform using the resist pattern 232 as a mask. Thus, the hard mask film 230 is processed into a predetermined pattern.

Figure 6B:
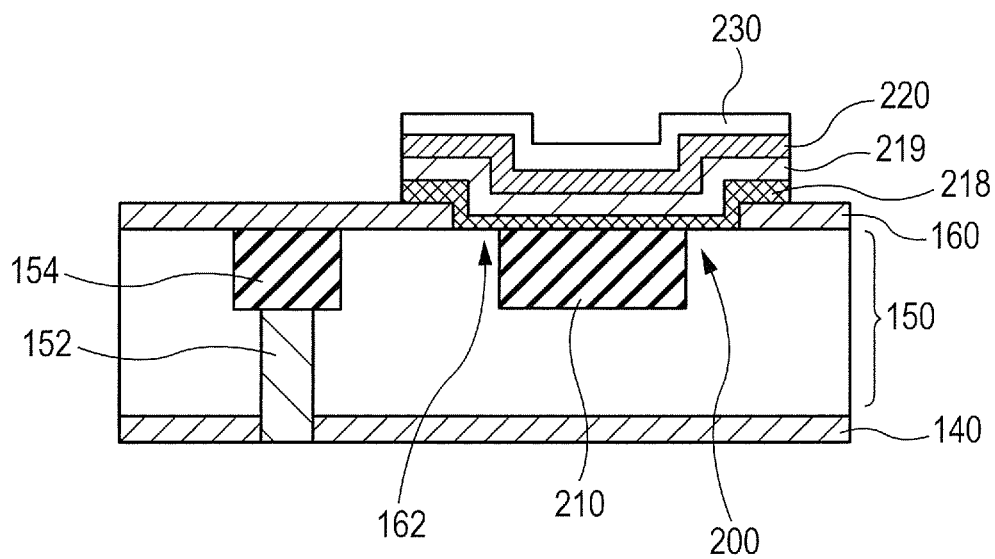

Then, as shown in FIG. 6(b), the resist pattern 232 is removed. Subsequently, etching of the semiconductor layer 220, the gate insulating film 219, and the gate electrode 218 is performed using the hard mask film 230 as a mask. Accordingly, the semiconductor layer 220, the gate insulating film 219, and the gate electrode 218 are processed into predetermined shapes. The semiconductor layer 220 is formed also over the gate insulating film 219 and over the diffusion prevention film 160 located around the gate insulating film 219.

Moreover, in this process, the semiconductor layer 220 located over the third wiring 154, the gate insulating film 219, and the gate electrode 218 is removed.

Subsequently, a source and a drain are formed in the semiconductor layer 220. Subsequently, an insulating film 174 which configures a second wiring layer 170 is formed over the diffusion prevention film 160 and over the hard mask film 230. Subsequently, a via hole and a wiring slot are formed in the insulating film 174. In a process of forming the via hole in the insulating film 174, the hard mask film 230 and the diffusion prevention film 160 function also as etching stoppers. In particular, when the hard mask film 230 has a film of the same material and thickness as those of the diffusion prevention film 160, it becomes easier to provide conditions for a process where the hard mask film 230 and the diffusion prevention film 160 which are located at the bottom of the via are passed through.

In addition, a process for forming the source and the drain in the semiconductor layer 220 may be performed here. For example, when a reduction plasma (for example, hydrogen plasma) treatment or a nitrogen-containing plasma (for example, ammonia plasma) treatment is given to a region, of the semiconductor layer 220, exposed at the bottom of the via hole, a source and a drain are formed in the semiconductor layers 220.

Subsequently, barrier metal films 185 and 187 are formed over the bottom surface and the sidewall of the via hole and the wiring slot, and over the insulating film 174. The barrier metal films 185 and 187 are formed by, for example, the sputtering method. Subsequently, inside the via hole and the wiring slot and over the insulating film 174, metal films are formed by, for example, the plating method. Subsequently, the metal film and the barrier metal films over the insulating film 174 are removed by, for example, the CMP method. Thus, the second wiring layer 170 is formed. The second wiring layer 170 includes a second wiring 186, a fourth wiring 188, a first via 184, and a via 189. In addition, as described above, the second wiring layer 170 may include an Al wiring. In this case, an electrode pad may be contained in the second wiring layer 170. Thus, the semiconductor device shown in FIG. 1 is formed.

Next, operation and effect of the present embodiment will be explained. According to the present embodiment, the gate electrode 218 is formed over the first wiring 210. For this reason, the conductive material which forms the gate electrode 218 can be different from that of the first wiring 210. For this reason, by choosing a suitable conductive material which forms the gate electrode 218, a work function of the gate electrode 218 can be adjusted and a threshold voltage of the transistor 200 can be set to a desired voltage. Moreover, either a normally-off type transistor or a normally-on type transistor can be chosen as the transistor 200.

Moreover, an upper surface of the first wiring 210 is covered with the gate electrode 218. Therefore, even if the diffusion prevention film 160 over the first wiring 210 is removed, the conductive material forming the first wiring 210 is prevented from diffusing into the second wiring layer 170.

Moreover, since the gate insulating film 219 is formed independently from the diffusion prevention film 160, a thickness of the gate insulation film 219 can be different from that of the diffusion prevention film 160. For this reason, the gate insulating film 219 can be made thinner, reducing the gate capacity of the transistor 200. Moreover, since the gate insulating film 219 is not required to function as a barrier film of the first wiring 210, the choice of the materials which can be used for the gate insulating film 219 increases.

Second Embodiment

Figure 7:
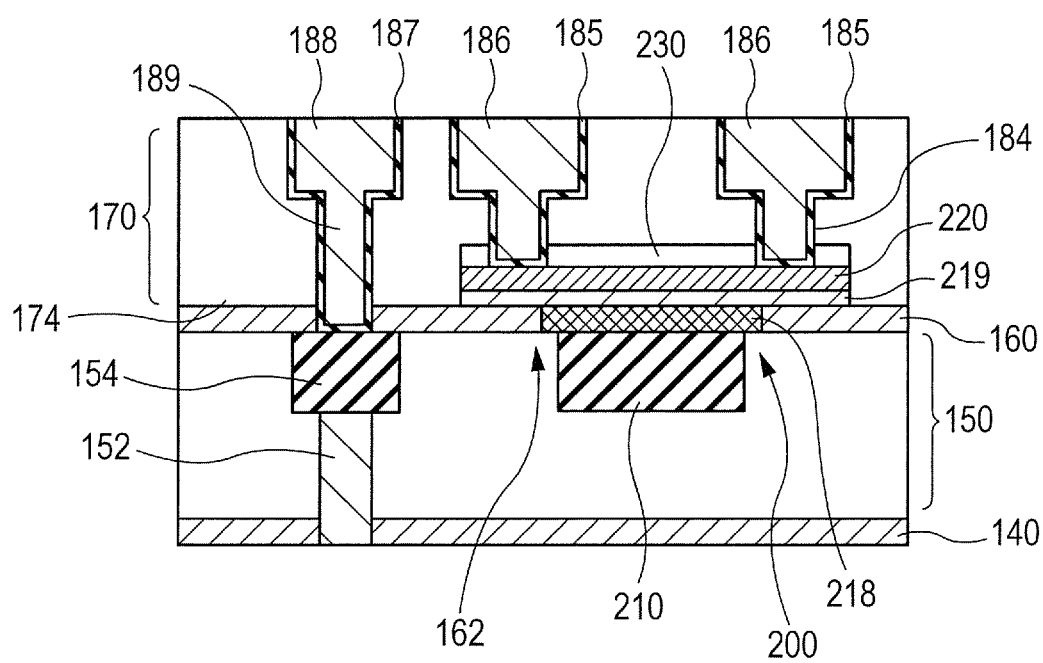
FIG. 7 is a cross-sectional view showing a configuration of a semiconductor device according to a second embodiment.
Figure 8:
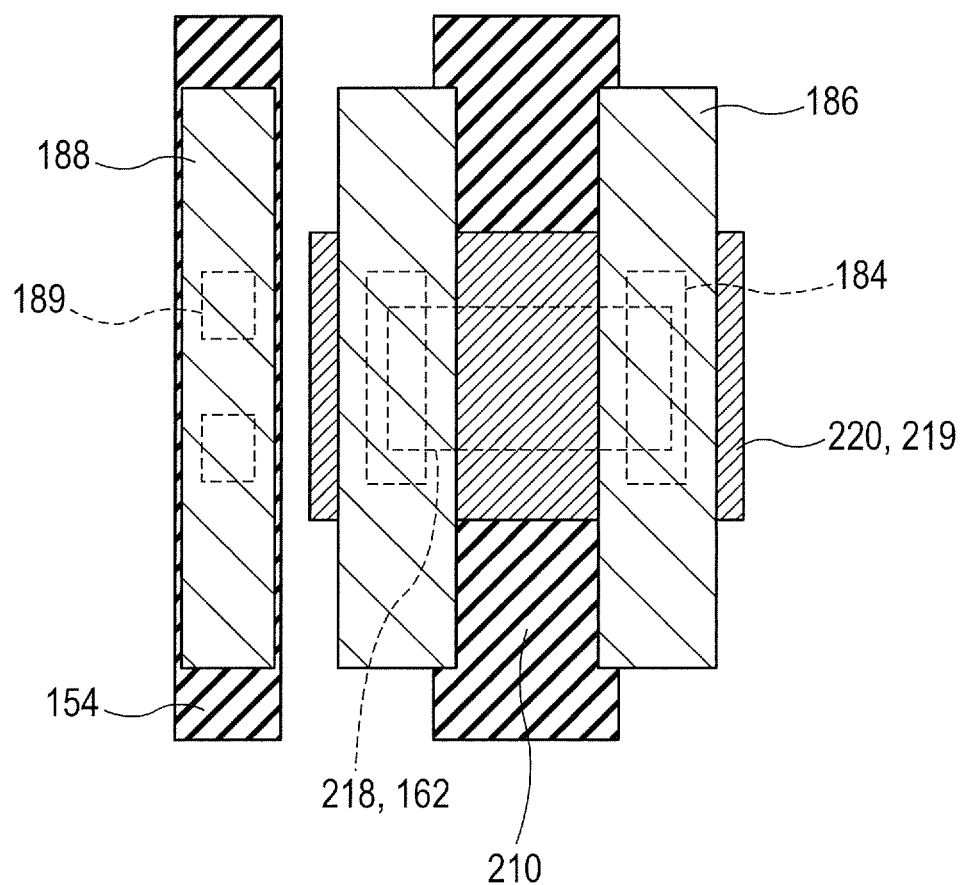
FIG. 8 is a plan view of the semiconductor device shown in FIG. 7.

FIG. 7 is a cross-sectional view showing a configuration of a semiconductor device according to a second embodiment. FIG. 8 is a plan view of the semiconductor device shown in FIG. 7. The semiconductor device of the present embodiment has a similar configuration to the semiconductor device according to the first embodiment except a shape of the gate electrode 218 of the transistor 200.

In the present embodiment, the gate electrodes 218 are located only in the opening 162. An upper surface of the gate electrode 218 forms the same surface (for example, the same plane) as an upper surface of the diffusion prevention film 160.

The gate insulating film 219 and the semiconductor layer 220 are formed over the gate electrodes 218 and over the diffusion prevention film 160 located around the gate electrode 218. That is, in a plan view, the semiconductor layer 220 is larger than the gate electrode 218. Also, in a plan view, a center of either of the two first vias 184 is not overlapped with the gate electrode 218. That is, the first via 184 is offset to the gate electrode 218. In the example shown in FIG. 7, the whole part of the two first vias 184 is not overlapped with the gate electrode 218.

Figure 9A:
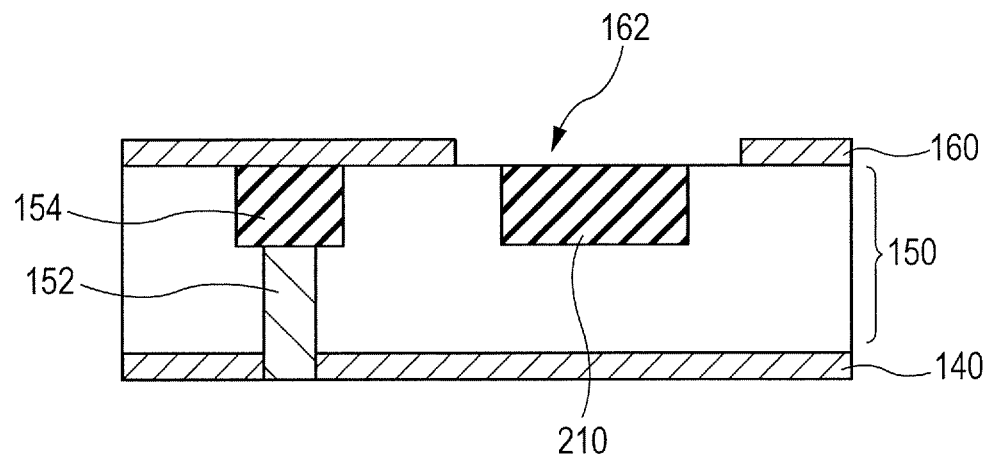
FIGS. 9(a) and 9(b) are cross-sectional views showing a method for manufacturing the semiconductor device of FIG. 7.

FIGS. 9(a), 9(b) and FIGS. 10(a) and 10(b) are cross-sectional views showing a method for manufacturing the semiconductor device shown in FIG. 7. First, as shown in FIG. 9(a), there are formed the diffusion prevention film 140, the first wiring layer 150, the via 152, the third wiring 154, the first wiring 210, the diffusion prevention film 160, and the opening 162. A method for forming these is similar to that of the first embodiment.

Figure 9B:
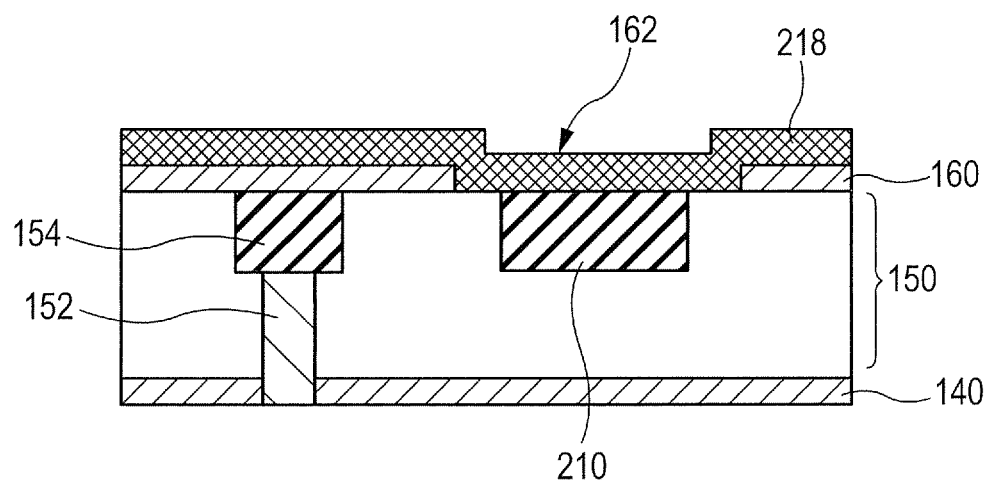

Subsequently, as shown in FIG. 9(b), the gate electrode 218 is formed in the opening 162 and over the diffusion prevention film 160. At this time, the gate electrode 218 is formed thicker than the diffusion prevention film 160.

Figure 10A:
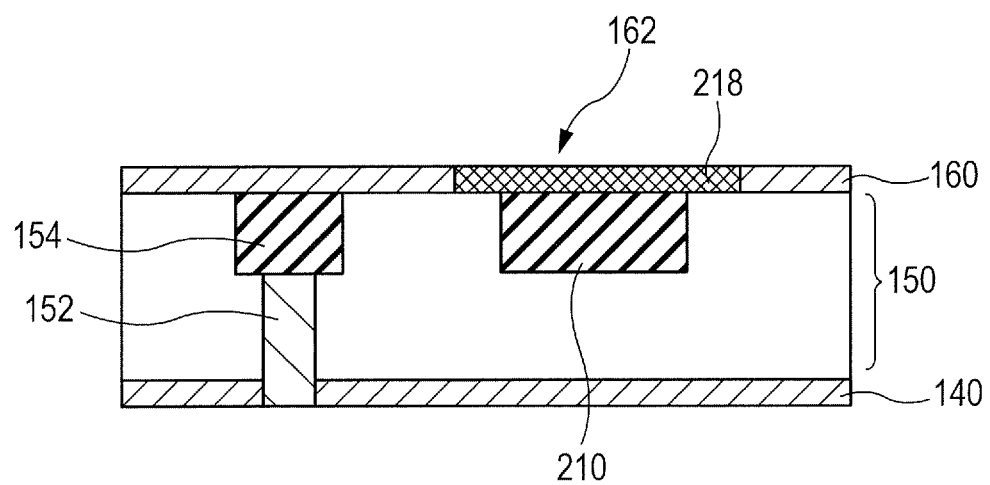
FIGS. 10(a) and 10(b) are cross-sectional views showing the method for manufacturing the semiconductor device of FIG. 7.

Subsequently, as shown in FIG. 10(a), the gate electrode 218 located over the diffusion prevention film 160 is removed by the CMP method. As a result, the gate electrode 218 is located only inside the opening 162. Moreover, the upper surface of the gate electrode 218 and the upper surface of the diffusion prevention film 160 form the same plane.

Figure 10B:
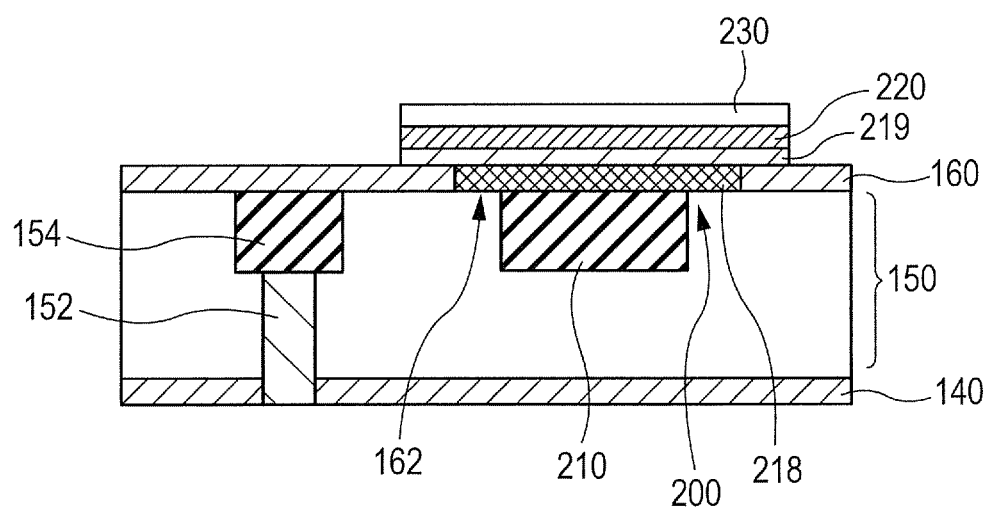

Subsequently, as shown in FIG. 10(b), the gate insulating film 219 and the semiconductor layer 220 are formed over the gate electrode 218 and over the whole surface of the diffusion prevention film 160. Subsequently, the hard mask film 230 is formed over the semiconductor layer 220. Subsequently, a resist pattern (not shown) is formed over the hard mask film 230, and etching of the hard mask film 230 is performed using the resist pattern as a mask. Thus, the hard mask film 230 comes to have a predetermined pattern. Subsequently, the resist pattern is removed as required. Then, etching of the semiconductor layer 220 and the gate insulation film 219 is performed using the hard mask film 230 as a mask. Thus, the semiconductor layer 220 and the gate insulating film 219 remain only over the gate electrode 218 and its periphery.

The subsequent processes are similar to those of the first embodiment.

According to the present embodiment also, effects similar to those of the first embodiment can be obtained. Moreover, the shape of the gate insulation film 219 and the semiconductor layer 220 and the shape of the gate electrode 218 can be different from each other. As a result, the end portion of the gate electrode 218 can be kept away from the end portion of the semiconductor layer 220, which can reduce a leak current flowing from the gate electrode 218 to the semiconductor layer 220. Thus, the reliability of the gate electrode 218 is improved.

Moreover, the shape of the gate electrode 218 can be set to a given shape by changing the shape of the opening 162. Moreover, the shapes of the gate insulating film 219 and the semiconductor layer 220 can be set to given shapes by changing the pattern of the hard mask film 230. As a result, of the region of the semiconductor layer 220 to be a channel, a region which is overlapped with the gate electrode 218 is allowed to have a desired shape and area. As a result, a resistant voltage between the source and the drain can be controlled.

Third Embodiment

Figure 11:
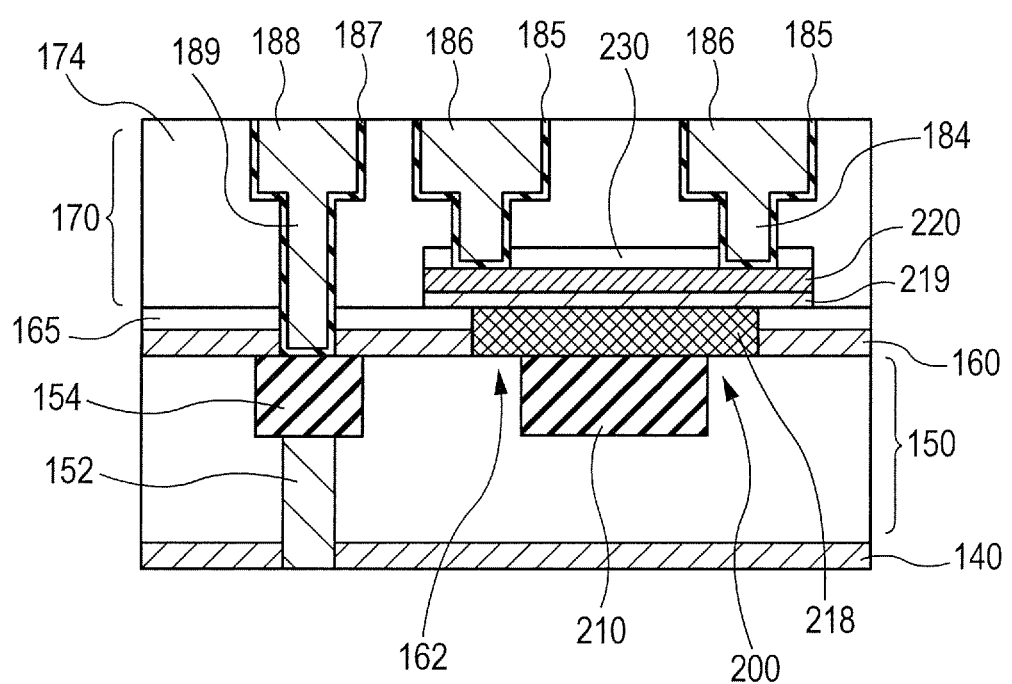
FIG. 11 is a cross-sectional view showing a configuration of a semiconductor device according to a third embodiment.

FIG. 11 is a cross-sectional view showing a configuration of a semiconductor device according to a third embodiment. The semiconductor device of the present embodiment has a similar configuration to the semiconductor device according to the second embodiment except the following points.

First, over the diffusion prevention film 160, a protective insulating film 165 is formed. The protective insulating film 165 is formed using the same material as that of the insulating film which configures the second wiring layer 170, for example. However, it may be a different material. For example, when the second wiring layer 170 is a low dielectric constant film, the protective insulation film 165 may be a silicon oxide film.

The opening 162 is formed in the diffusion prevention film 160 and the protective insulation film 165. The upper surface of the gate electrode 218 forms the same surface (for example, the same plane) as the upper surface of the protective insulating film 165. A stacked structure of the gate insulating film 219, the semiconductor layer 220, and the hard mask film 230 is formed over the gate electrode 218, and over the protective insulating film 165 located around the gate electrode 218.

Figure 12A:
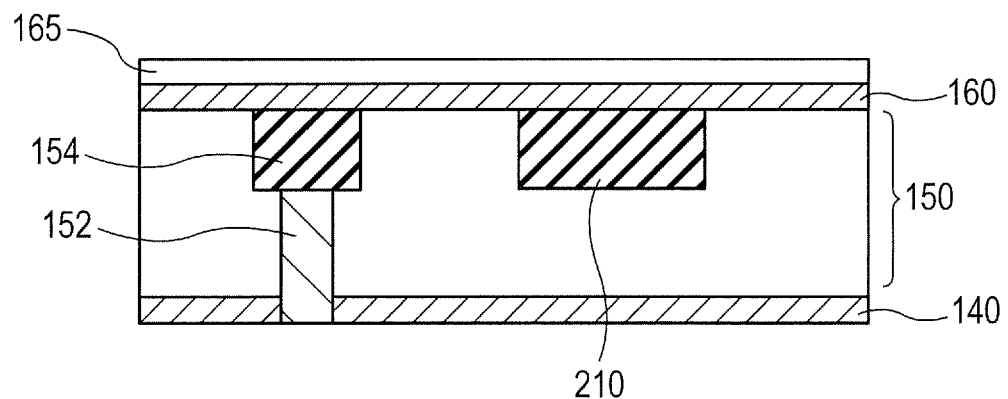
FIGS. 12(a) and 12(b) are cross-sectional views showing a method for manufacturing the semiconductor device of FIG. 11.

FIGS. 12(a) and 12(b) to FIGS. 14(a) and 14(b) are cross-sectional views showing a method for manufacturing the semiconductor device shown in FIG. 11. First, as shown in FIG. 12(a), there are formed the diffusion prevention film 140, the first wiring layer 150, the via 152, the third wiring 154, the first wiring 210, and the diffusion prevention film 160. A method of forming these is similar to that of the second embodiment. Subsequently, the protective insulating film 165 is formed over the diffusion prevention film 160.

Figure 12B:
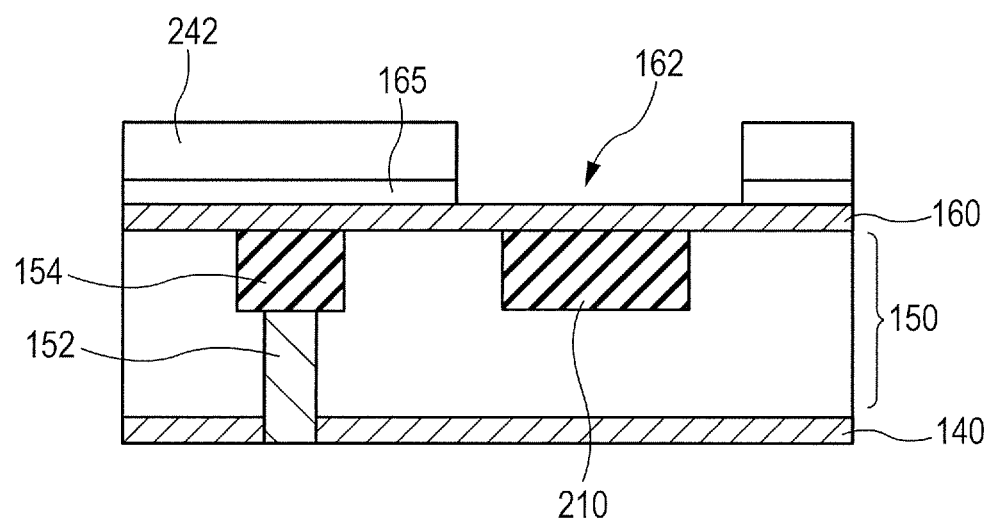

Subsequently, as shown in FIG. 12(b), a resist pattern 242 is formed over the protective insulating film 165. Subsequently, etching of the protective insulating film 165 is performed using the resist pattern 242 as a mask. Accordingly, the opening 162 is formed in the protective insulating film 165. However, at this stage, the opening 162 has not passed through the diffusion prevention film 160.

Figure 13A:
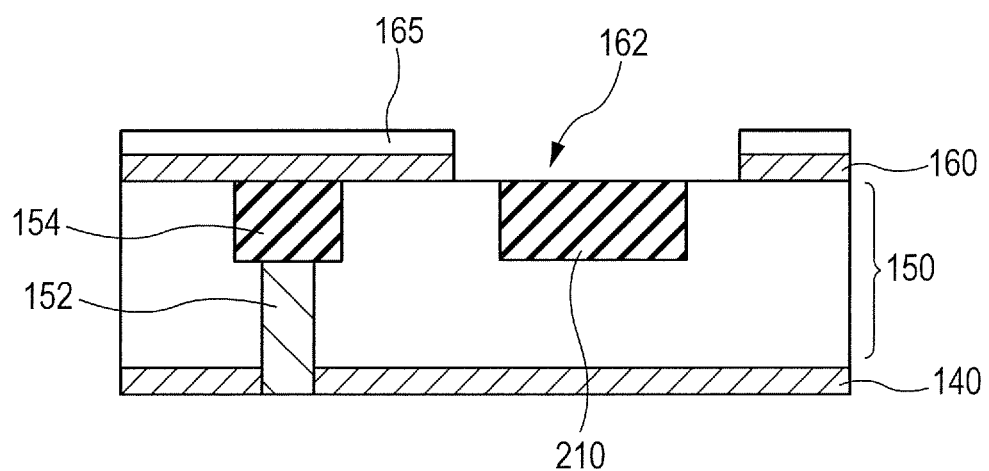
FIGS. 13(a) and 13(b) are cross-sectional views showing the method for manufacturing the semiconductor device of FIG. 11.

Subsequently, as shown in FIG. 13(a), the resist pattern 242 is removed. Subsequently, using the protective insulating film 165 as a mask, etching of the diffusion prevention film 160 is performed. As a result, the opening 162 passes through the diffusion prevention film 160, and the first wiring 210 is exposed at the bottom surface of the opening 162.

Figure 13B:
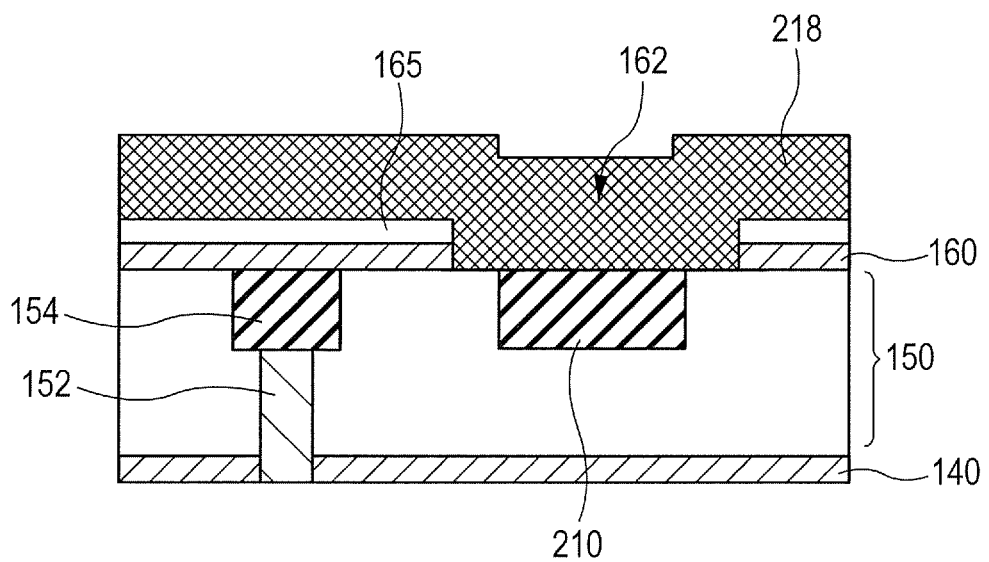

Subsequently, as shown in FIG. 13(b), the gate electrode 218 is formed inside the opening 162 and over the protective insulation film 165. At this time, a thickness of the gate electrode 218 is made greater than a thickness of the stacked structure of the diffusion prevention film 160 and the protective insulating film 165.

Figure 14A:
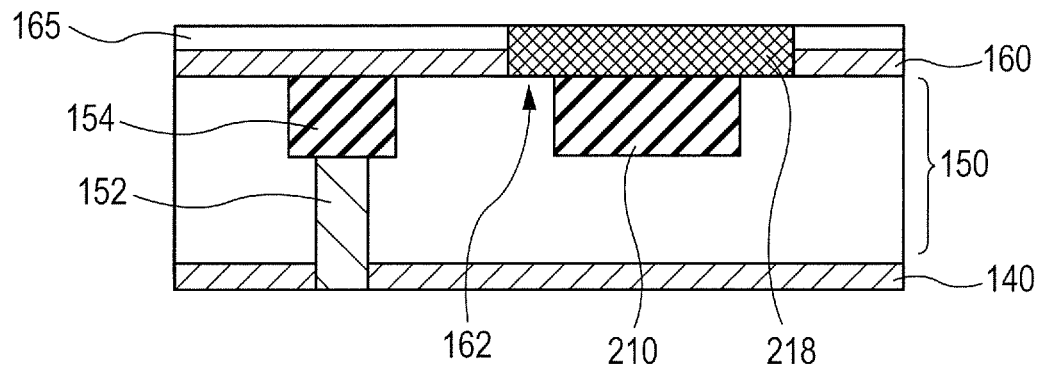
FIGS. 14(a) and 14(b) are cross-sectional views showing the method for manufacturing the semiconductor device of FIG. 11.

Subsequently, as shown in FIG. 14(a), the gate electrode 218 located over the protective insulating film 165 is removed by the CMP method. As a result, the gate electrode 218 is located only inside the opening 162. Moreover, the upper surface of the gate electrode 218 has the same plane as the upper surface of the protective insulating film 165.

Figure 14B:
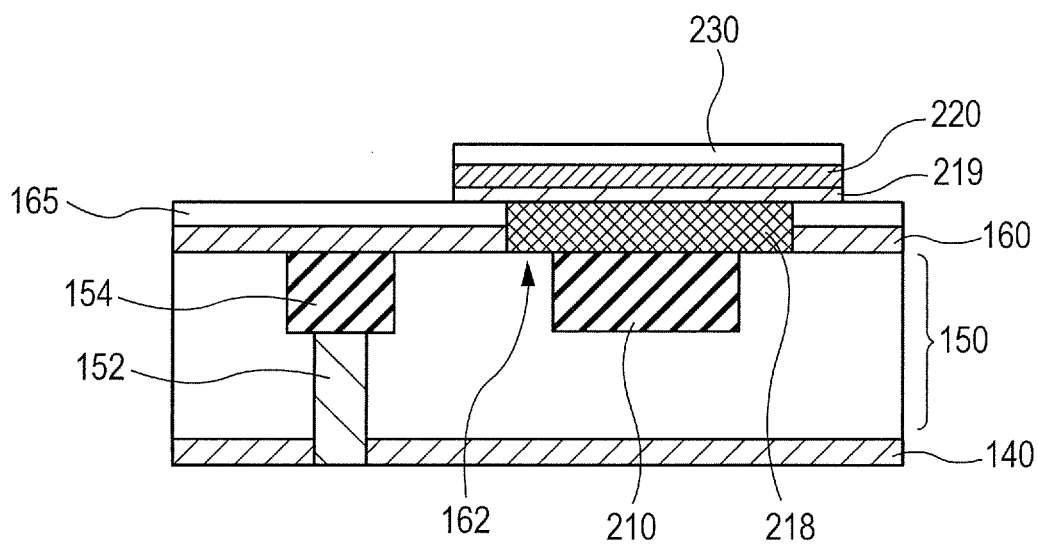

Subsequently, as shown in FIG. 14(b), a stacked structure of the gate insulating film 219, the semiconductor layer 220, and the hard mask film 230 is formed over the protective insulating film 165. A method for forming these is similar to that of the second embodiment.

The subsequent processes are similar to those of the second embodiment.

According to the present embodiment also, effects similar to those of the second embodiment can be obtained. Moreover, the diffusion prevention film 160 is covered with the protective insulating film 165. Therefore, of the gate electrode 218, unnecessary portions are formed over the protective insulating film 165. For this reason, when removing the unnecessary portion of the gate electrode 218 by the CMP method, the diffusion prevention film 160 is prevented from being damaged. For this reason, the conductive material which forms the third wiring 154 is prevented from diffusing into the second wiring layer 170.

Moreover, the opening 162 is formed in the stacked structure of the diffusion prevention film 160 and the protective insulating film 165. Therefore, as compared to the one in the second embodiment, the gate electrode 21B can be thicker. Therefore, the semiconductor layer 220 can be kept away from the first wiring 210. As a result, effects of the first wiring 210 to be given to transistor properties of the transistor 200, such as a threshold voltage and reliability, can be suppressed.

Fourth Embodiment

Figure 15:
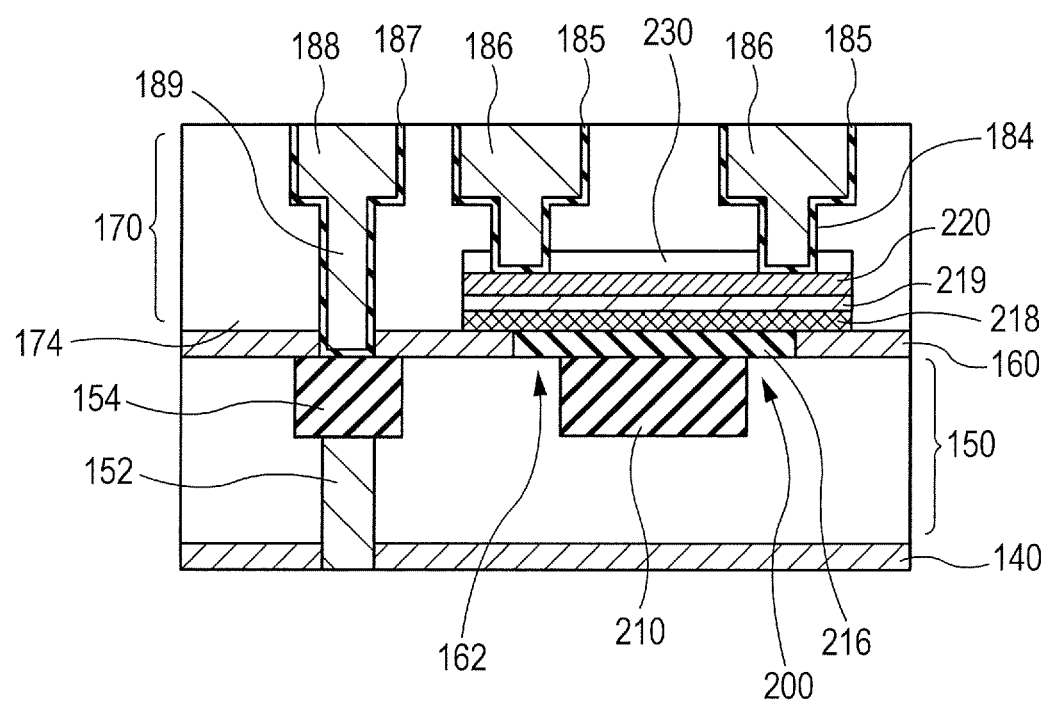
FIG. 15 is a cross-sectional view showing a configuration of a semiconductor device according to a fourth embodiment.

FIG. 15 is a cross-sectional view showing a configuration of a semiconductor device according to a fourth embodiment. The semiconductor device of the present embodiment has a similar configuration to the semiconductor device according to the second embodiment except the following points.

First, in the opening 162 of the diffusion prevention film 160, a barrier metal film 216 is formed. The barrier metal film 216 include, for example, Ti, Ta, W, TiN, TaN, and WN films, a compound containing Co or W, a film made by introducing at least one of C and O to one of the above, or a stacked film made by stacking two or more kinds of these films. The barrier metal film 216 has, for example, the same thickness as that of the diffusion prevention film 160. However, it may be thinner than the diffusion prevention film 160.

The gate electrode 218 is formed over the barrier film 216 and over the diffusion prevention film 160 located around the barrier metal film 216. That is, according to the present embodiment, the gate electrode 218 is coupled to the first wiring 210 through the barrier metal film 216. The stacked structure of the gate insulating film 219, the semiconductor layer 220, and the hard mask film 230 has the same planar shape as the gate electrode 218.

Figure 16A:
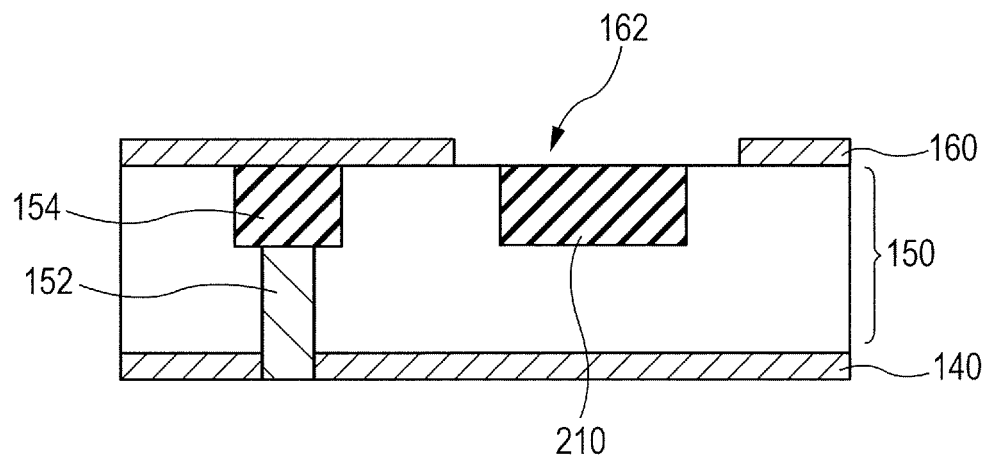
FIGS. 16(a) and 16(b) are cross-sectional views showing a method for manufacturing the semiconductor device of FIG. 15.

FIGS. 16(a), 16(b) and FIGS. 17(a) and 17(b) are cross-sectional views showing a method for manufacturing the semiconductor device shown in FIG. 15. First, as shown in FIG. 16(a), there are formed the diffusion prevention film 140, the first wiring layer 150, the via 152, the third wiring 154, the first wiring 210, the diffusion prevention film 160, and the opening 162. A method for forming these is similar to that of the second embodiment.

Figure 16B:
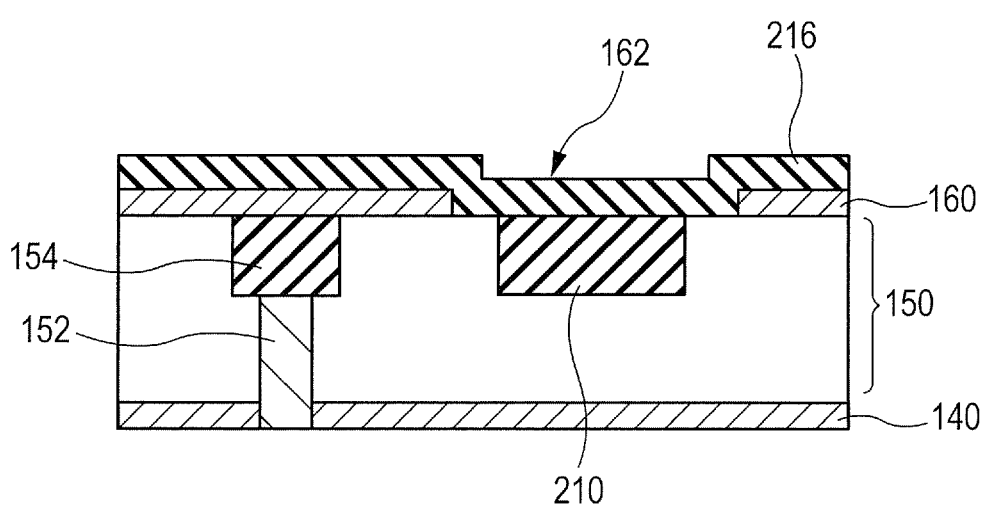

Subsequently, as shown in FIG. 16(b), the barrier metal film 216 is formed inside the opening 162 and over the diffusion prevention film 160. At this time, the barrier metal film 216 is made thicker than the diffusion prevention film 160.

Figure 17A:
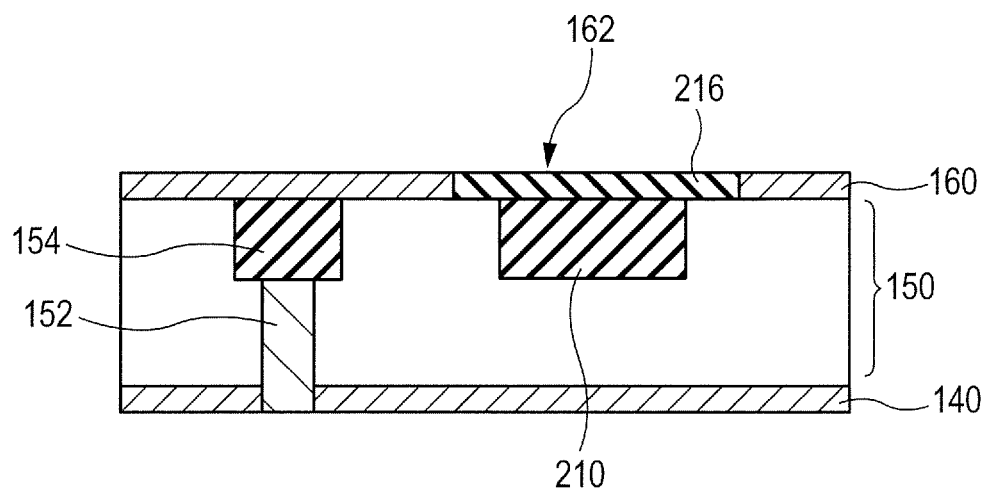
FIGS. 17(a) and 17(b) are cross-sectional views showing the method for manufacturing the semiconductor device of FIG. 15.
Figure 17B:
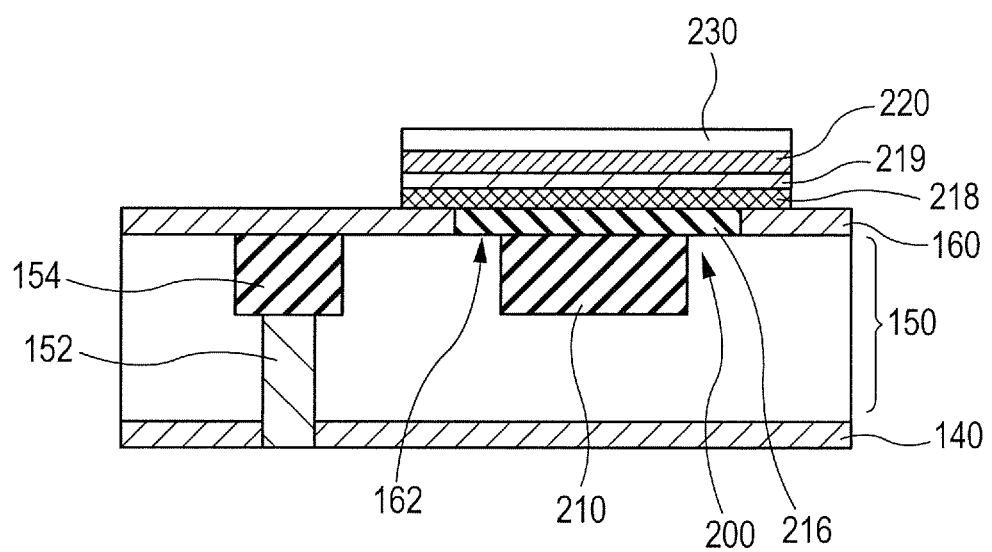

Subsequently, as shown in FIG. 17(a), the barrier metal film 216 located over the diffusion prevention film 160 is removed by the CMP method. As a result, the barrier metal film 216 is located only in the opening 162. Moreover, the upper surface of the barrier metal film 216 and the upper surface of the diffusion prevention film 160 form the same plane.

Subsequently, the gate electrode 218, the gate insulating film 219, and the semiconductor layer 220 are formed over the barrier metal film 216 and over the whole surface of the diffusion prevention film 160. Subsequently, the hard mask film 230 is formed over the semiconductor layer 220. Subsequently, a resist pattern (not shown) is formed over the hard mask film 230 and, using the resist pattern as a mask, etching of the hard mask film 230 is performed. As a result, the hard mask film 230 comes to have a predetermined pattern. Subsequently, the resist pattern is removed as required. Then, using the hard mask film 230 as a mask, etching of the semiconductor layer 220, the gate insulating film 219, and the gate electrode 218 is performed. Accordingly, the semiconductor layer 220, the gate insulating film 219, and the gate electrode 218 remain only over and around the barrier metal film 216.

Subsequent processes are similar to those of the second embodiment.

According to the present embodiment also, effects similar to those of the first embodiment can be obtained. Moreover, the barrier metal film 216 is formed between the gate electrode 218 and the first wiring 210. For this reason, it is possible to further prevent the conductive material which forms the first wiring 210 from diffusing into the second wiring layer 170.

When choosing the material for the gate electrode 218, it becomes unnecessary to consider a diffusion prevention function. Therefore, the choice of the material for the gate electrode 218 increases. Moreover, it becomes possible also to allow the gate electrode 218 to be thinner. For example, as materials for the gate electrode 218, Ti, Ta, Al, Hf, W, Ni, Co, Pt, and a compound thereof (nitride, carbide, oxygen compound, complex metal, and silicide) can be used.

Fifth Embodiment

Figure 18:
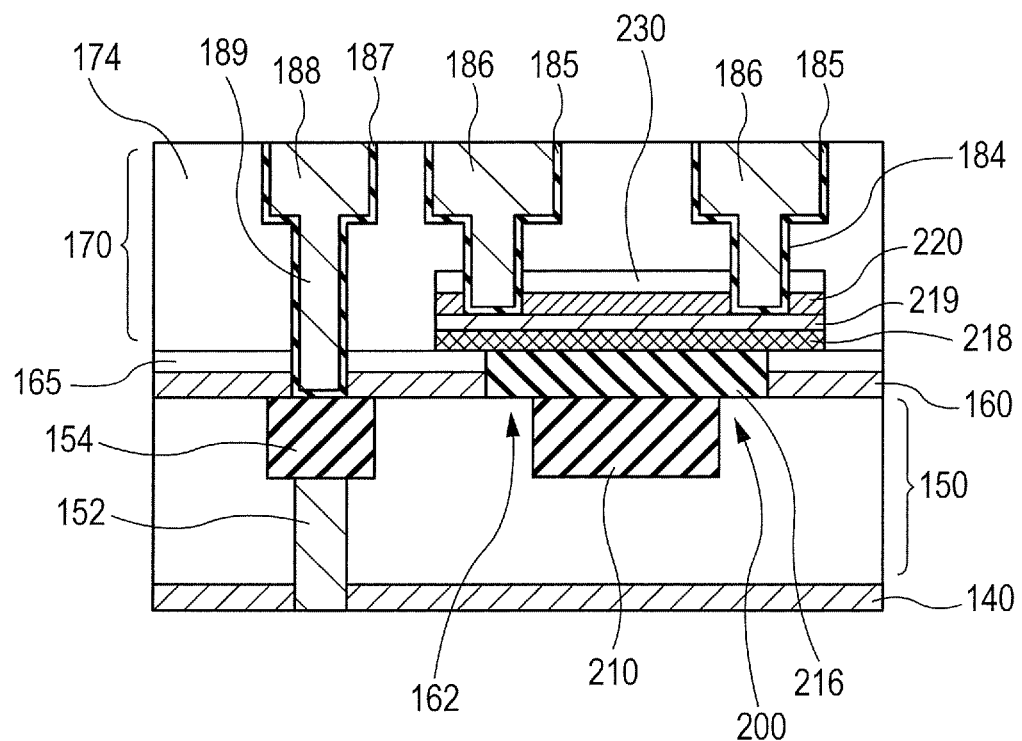
FIG. 18 is a cross-sectional view showing a configuration of a semiconductor device according to a fifth embodiment.

FIG. 18 is a cross-sectional view showing a configuration of a semiconductor device according to a fifth embodiment. The semiconductor device of the present embodiment has a similar configuration to the semiconductor device according to the fourth embodiment, except in that the semiconductor device has a protective insulating film 165.

A configuration of the protective insulating film 165 is the same as that of the third embodiment. The opening 162 is formed in a stacked structure of the diffusion prevention film 160 and the protective insulating film 165. An upper surface of the barrier metal film 216 and an upper surface of the protective insulating film 165 form the same plane. A stacked structure of the gate electrode 218, the gate insulating film 219, the semiconductor layer 220, and the hard mask film 230 is formed over the barrier metal film 216 and over the protective insulating film 165 located around the barrier metal film 216.

FIGS. 19(a), 19(b), FIGS. 20(a) and 20(b) are cross-sectional views showing a method for manufacturing the semiconductor device shown in FIG. 18. First, as shown in 19(a), there are formed the diffusion prevention film 140, the first wiring layer 150, the via 152, the third wiring 154, the first wiring 210, the diffusion prevention film 160, the protective insulating film 165, and the opening 162. A method for forming these is similar to that of the third embodiment.

Figure 19A:
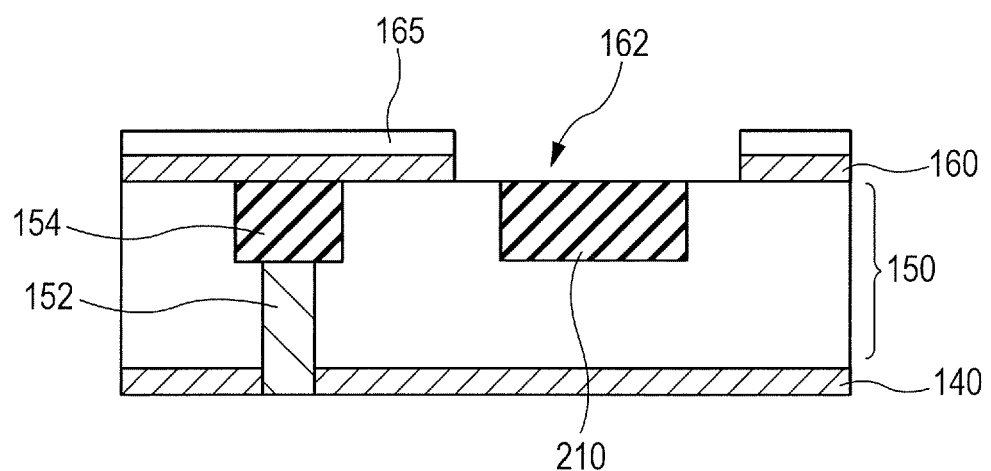
FIGS. 19(a) and 19(b) are cross-sectional views showing a method for manufacturing the semiconductor device of FIG. 18.
Figure 19B:
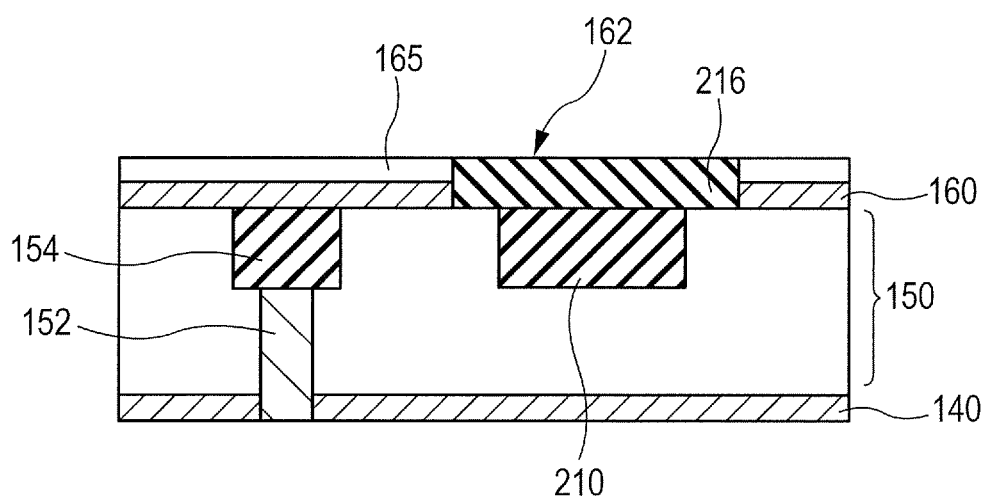

Subsequently, as shown in FIG. 19(b), the barrier metal film 216 is formed in the opening 162 and over the protective insulation film 165. At this time, the barrier metal film 216 is made thicker than a stacked structure of the diffusion prevention film 160 and the protective insulating film 165.

Subsequently, the barrier metal film 216 located over the protective insulating film 165 is removed by the CMP method. As a result, the barrier metal film 216 is located inside the opening 162 only. Moreover, the upper surface of the barrier metal film 216 and the upper surface of the protective insulating film 165 form the same plane.

Figure 20:
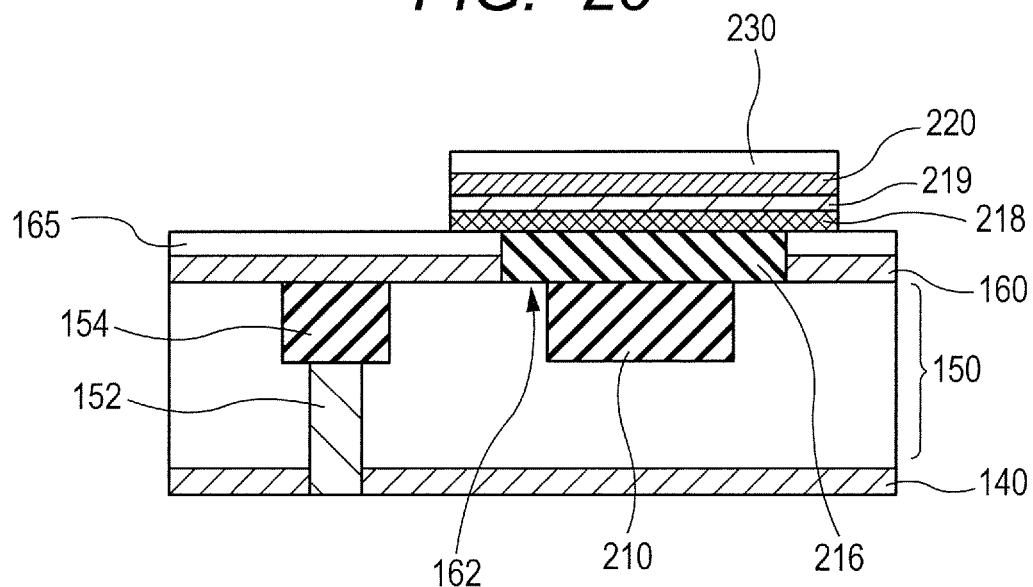
FIG. 20 is a cross-sectional view showing the method for manufacturing the semiconductor device of FIG. 18.

Subsequently, as shown in FIG. 20, the gate electrode 218, the gate insulating film 219, the semiconductor layer 220, and the hard mask film 230 are formed over the barrier metal film 216 and over the protective insulating film 165 around the barrier metal film 216. A method for forming these is similar to that of the fourth embodiment.

Subsequent processes are similar to those of the fourth embodiment.

According to the present embodiment also, effects similar to those of the fourth embodiment can be obtained. Moreover, since the protective insulating film 165 is formed, the same effect as in the third embodiment can also be obtained.

Sixth Embodiment

Figure 21:
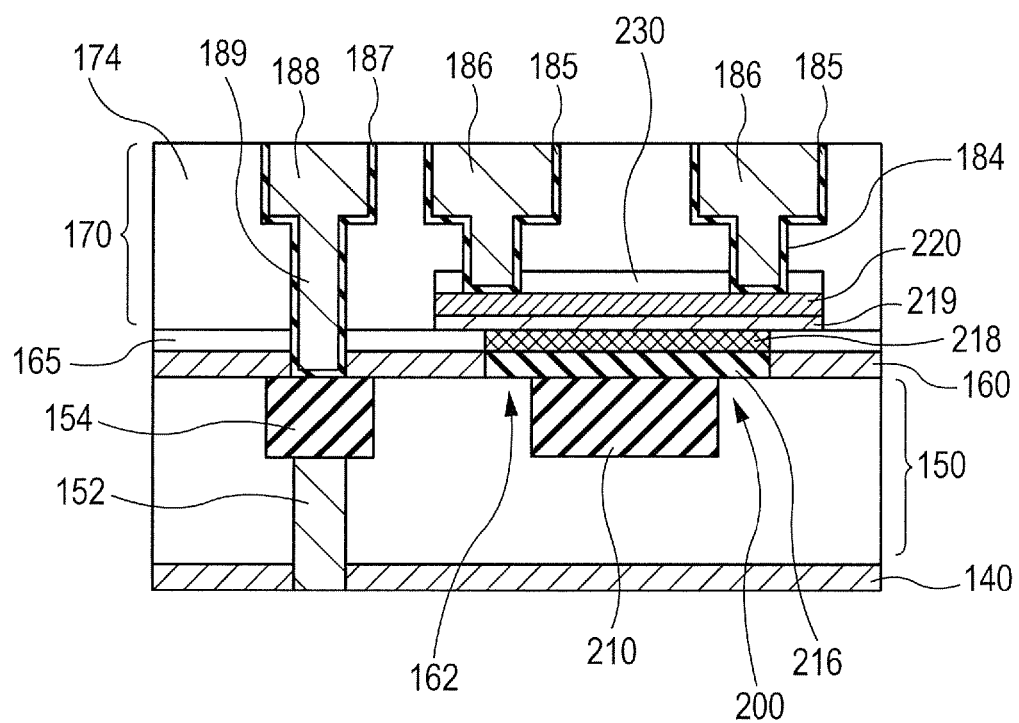
FIG. 21 is a cross-sectional view showing a configuration of a semiconductor device according to a sixth embodiment.

FIG. 21 is a cross-sectional view showing a configuration of a semiconductor device according to a sixth embodiment. The semiconductor device of the present embodiment has a similar configuration to the semiconductor device according to the fifth embodiment except the following points.

First, the barrier metal film 216 is thinner than the stacked structure of the diffusion prevention film 160 and the protective insulating film 165. Moreover, the gate electrode 218 is embedded in the opening 162. The upper surface of the gate electrode 218 and the upper surface of the protective insulating film 165 form the same plane. Further, the stacked structure of the gate insulating film 219, the semiconductor layer 220, and the hard mask film 230 is formed over the gate electrode 218 and over the protective insulating film 165 located around the gate electrode 218. The thickness of the gate electrode 218 and the thickness of the barrier metal film 216 are designed based on respective functions which they are asked for. For this reason, the boundary between the diffusion prevention film 160 and the protective insulating film 165 and the boundary between the barrier metal film 216 and the gate electrode 218 may be at a position of the same height, or may be at positions of different heights.

Figure 22A:
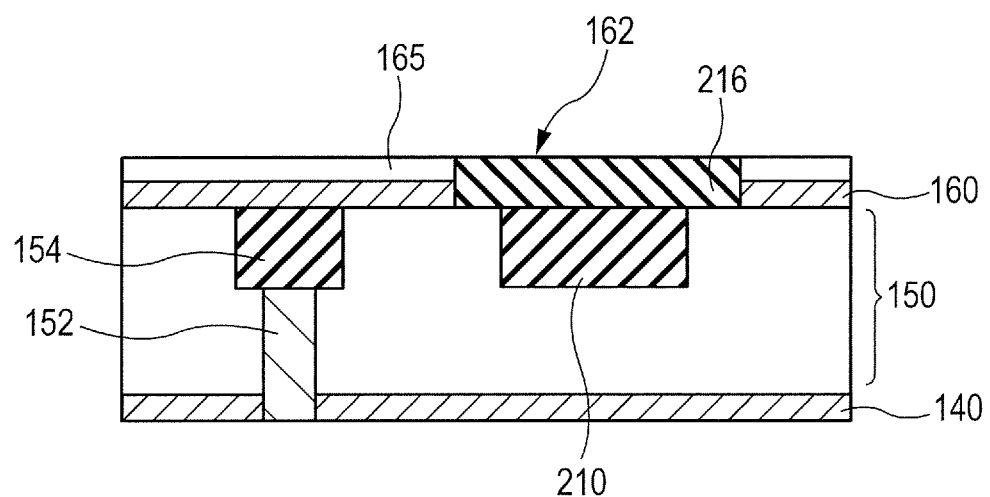
FIGS. 22(a) and 22(b) are cross-sectional views showing a method for manufacturing the semiconductor device shown in FIG. 21.

FIGS. 22(a), 22(b), FIGS. 23(a) and 23(b) are cross-sectional views showing a method for manufacturing the semiconductor device shown in FIG. 21. First, as shown in FIG. 22(a), there are formed the diffusion prevention film 140, the first wiring layer 150, the via 152, the third wiring 154, the first wiring 210, the diffusion prevention film 160, the protective insulating film 165, the opening 162, and the barrier metal film 216. A method for forming these is similar to that of the fifth embodiment. At this stage, the upper surface of the barrier metal film 216 and the upper surface of the protective insulating film 165 form the same plane.

Figure 22B:
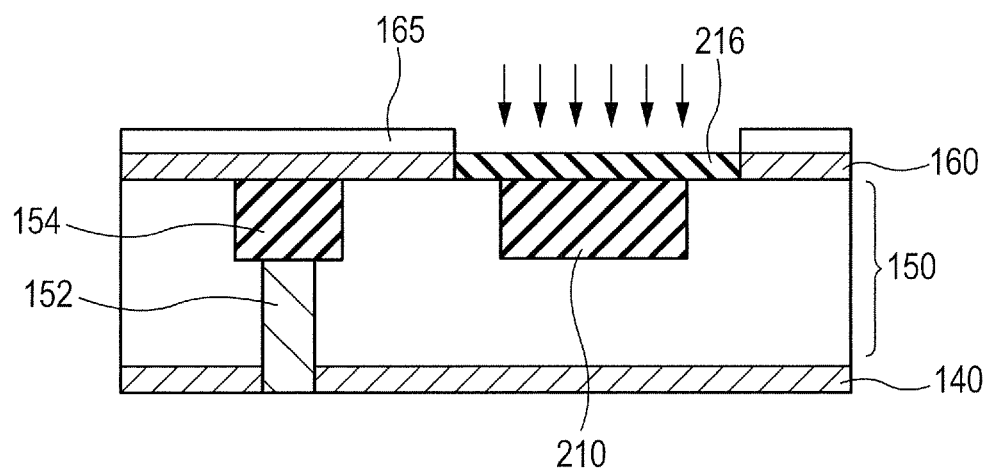

Subsequently, as shown in FIG. 22(b), an etch back of the barrier metal film 216 is performed. As a result, the upper surface of the barrier metal film 216 becomes lower than the upper surface of the protective insulating film 165.

Figure 23A:
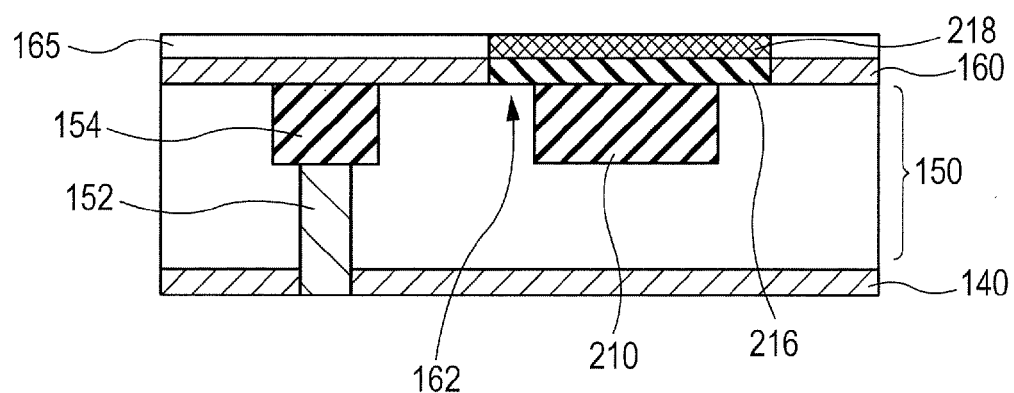
FIGS. 23(a) and 23(b) are cross-sectional views showing the method for manufacturing the semiconductor device of FIG. 21.

Subsequently, as shown in FIG. 23(a), the gate electrodes 218 are formed over the barrier metal film 216 and over the protective insulating film 165. Subsequently, the gate electrode 218 located over the barrier metal film 216 is removed by the CMP method. As a result, the gate electrode 218 is embedded into a portion, located over the barrier metal film 216, of the opening 162. The upper surface of the gate electrode 218 and the upper surface of the protective insulating film 165 form the same plane.

Figure 23B:
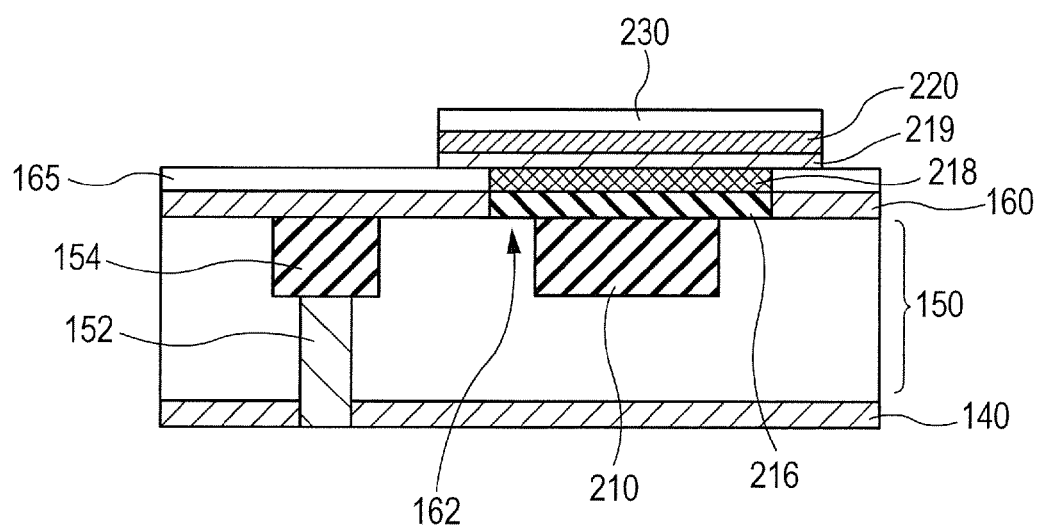

Subsequently, as shown in FIG. 23(b), there is formed a stacked structure of the gate insulating film 219, the semiconductor layer 220, and the hard mask film 230 over the gate electrode 218 and over the protective insulating film 165 located around the gate electrode 218. A method for forming these is similar to that of the third embodiment.

Subsequent processes are similar to those of the third embodiment.

According to the present embodiment also, effects similar to those of the fifth embodiment can be obtained. Moreover, since the gate electrode 218 is embedded in the opening 162, the same effect as in the third embodiment can be obtained.

Seventh Embodiment

Figure 24:
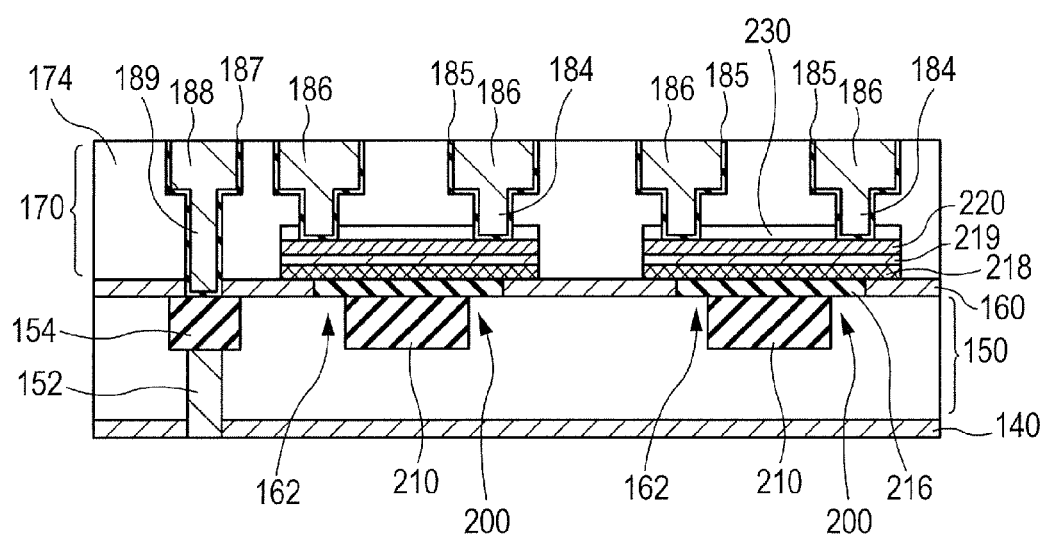
FIG. 24 is a cross-sectional view showing a configuration of a semiconductor device according to a seventh embodiment.

FIG. 24 is a cross-sectional view showing a configuration of a semiconductor device according to a seventh embodiment. The semiconductor device of the present embodiment has a similar configuration to the semiconductor device according to the fourth embodiment, except in that the semiconductor device has a transistor 201 other than the transistor 200.

The transistor 201 is formed in the same layer as the transistor 200. The transistor 201 has the same configuration as that of the transistor 200 except for the combination of the materials for the gate electrode 218, the gate insulating film 219, and the semiconductor layer 220. For example, when conductive types of the channels of the transistor 200 and the transistor 201 are the same, threshold voltages of the transistor 200 and the transistor 201 can be changed by allowing the combinations of the materials for the gate electrode 218, the gate insulating film 219, and the semiconductor layer 220 to be different between the transistor 200 and the transistor 201. Moreover, the transistor 201 can also be used as a P-channel type transistor and the transistor 200 can be used as an N-channel type transistor.

Figure 25A:
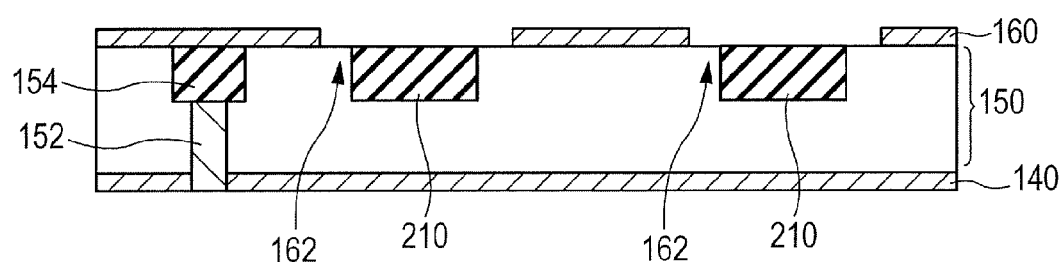
FIGS. 25(a) and 25(b) are cross-sectional views showing a method for manufacturing the semiconductor device shown in FIG. 24.

FIGS. 25(a), 25(b), FIGS. 26(a) and 26(b) are cross-sectional views showing a method for manufacturing the semiconductor device shown in FIG. 24. First, as shown in FIG. 25(a), there are formed the diffusion prevention film 140, the first wiring layer 150, the via 152, the third wiring 154, the first wiring 210, the diffusion prevention film 160, and openings 162. These processes are similar to those of the fourth embodiment, except in that the first wiring 210 and the openings 162 are formed at two locations.

Figure 25B:
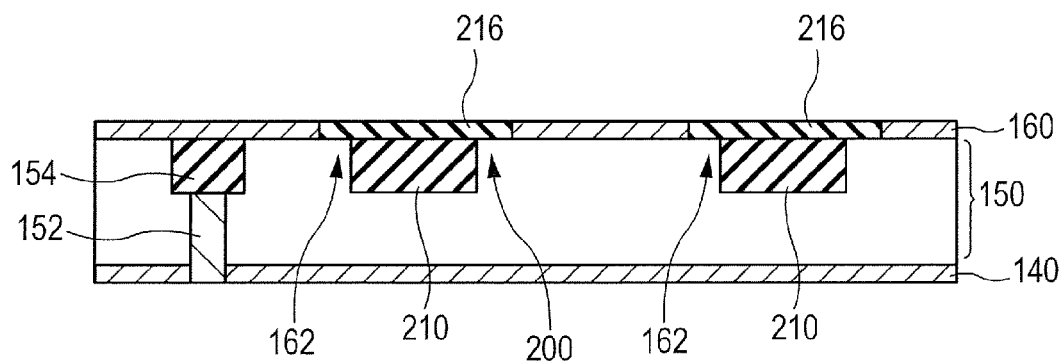

Subsequently, as shown in FIG. 25(b), the barrier metal films 216 are embedded into the two openings 162, respectively. A method for forming these is also similar to that of the fourth embodiment.

Figure 26A:
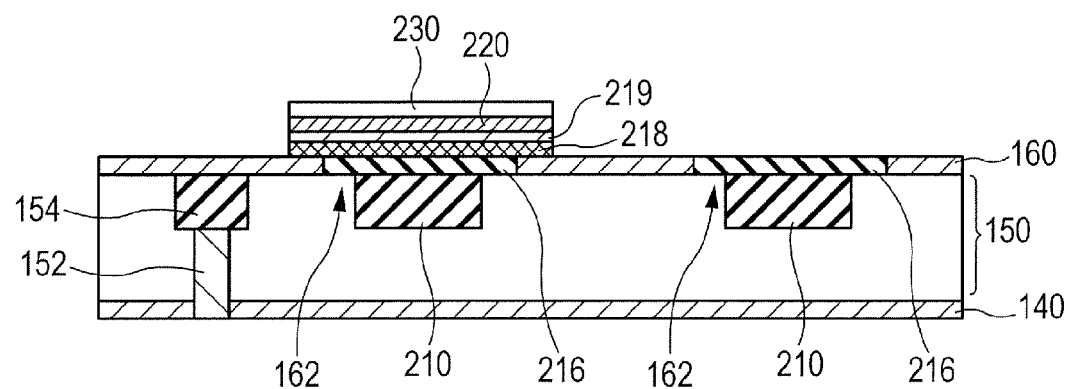
FIGS. 26(a) and 26(b) are cross-sectional views showing the method for manufacturing the semiconductor device shown in FIG. 24.

Subsequently, as shown in FIG. 26(a), there are formed the gate electrode 218, the gate insulating film 219, and the semiconductor layer 220 which configure a transistor 200 over the diffusion prevention film 160 and the barrier metal film 216. Subsequently, the hard mask film 230 which configures the transistor 200 is formed over the semiconductor layer 220. Subsequently, using the hard mask film 230 as a mask, etching of the semiconductor layer 220, the gate insulating film 219, and the gate electrode 218 is performed. As a result, the gate electrode 218, the gate insulating film 219, and the semiconductor layer 220 of the transistor 200 are formed.

Figure 26B:
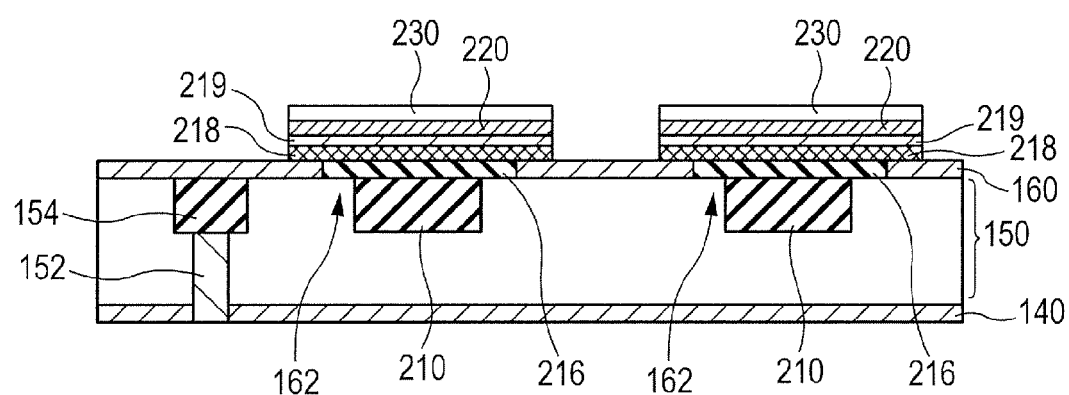

Subsequently, as shown in FIG. 26(b), there are formed the gate electrode 218 which configures the transistor 201, the gate insulating film 219, and the semiconductor layer 220 over the diffusion prevention film 160 and the barrier metal film 216 in which the transistor 201 is formed. Subsequently, the hard mask film 230 which forms the transistor 201 is formed over the semiconductor layer 220. Subsequently, using the hard mask film 230 as a mask, etching of the semiconductor layer 220, the gate insulating film 219, and the gate electrode 218 is performed. Thus, the gate electrode 218, the gate insulating film 219, and the semiconductor layer 220 of the transistor 201 are formed.

Subsequent processes are similar to those of the fourth embodiment.

According to the present embodiment also, effect similar to those of the fourth embodiment can be obtained. Moreover, the transistor 200 and the transistor 201 having different properties can be formed in the same layer.

Eighth Embodiment

Figure 27:
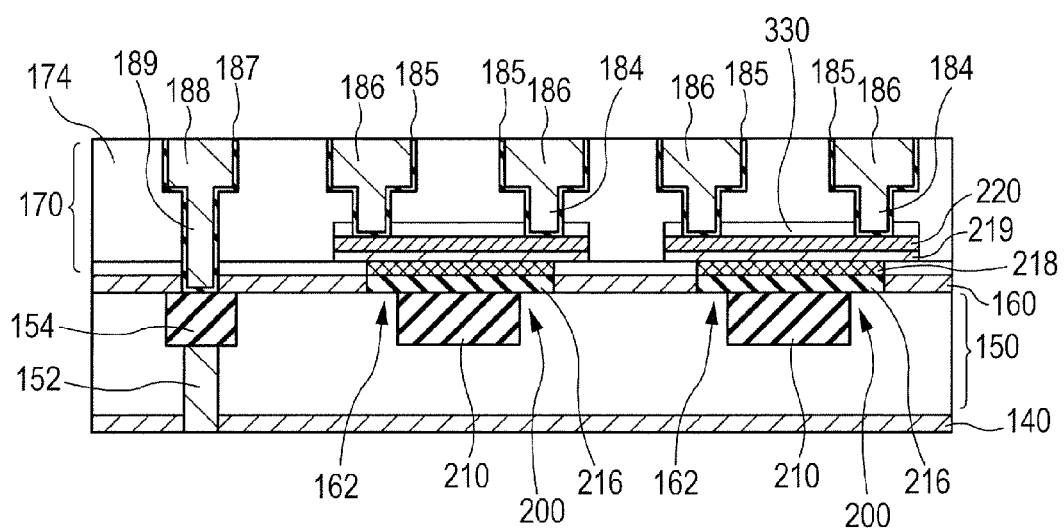
FIG. 27 is a cross-sectional view showing a configuration of a semiconductor device according to an eighth embodiment.

FIG. 27 is a cross-sectional view showing a configuration of a semiconductor device according to an eighth embodiment. The semiconductor device of the present embodiment has a similar configuration to the semiconductor device according to the seventh embodiment, except in that the transistors 200 and 201 have a similar configuration to the transistor 200 according to the sixth embodiment.

Figure 28A:
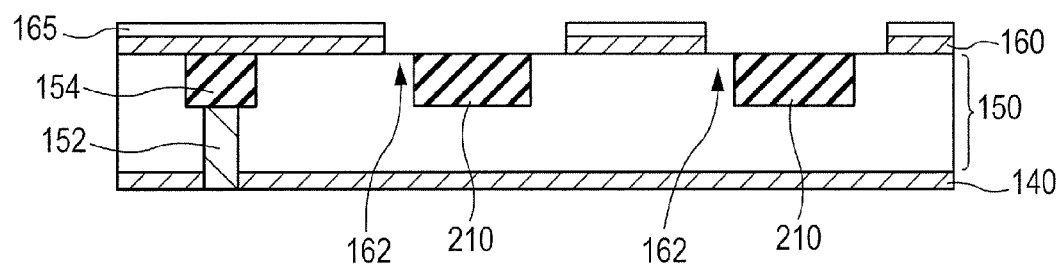
FIGS. 28(a) and 28(b) are cross-sectional views showing a method for manufacturing the semiconductor device shown in FIG. 27.

FIGS. 28(a) and 28(b) to FIGS. 31(a) and 31(b) are cross-sectional views showing a method for manufacturing the semiconductor device shown in FIG. 27. First, as shown in FIG. 28(a), the diffusion prevention film 140, the first wiring layer 150, the via 152, the third wiring 154, the first wiring 210, the diffusion prevention film 160, the protective insulating film 165, and the opening 162 are formed. These processes are similar to those of the sixth embodiment, except in that the first wiring 210 and the opening 162 are formed at two locations.

Figure 28B:
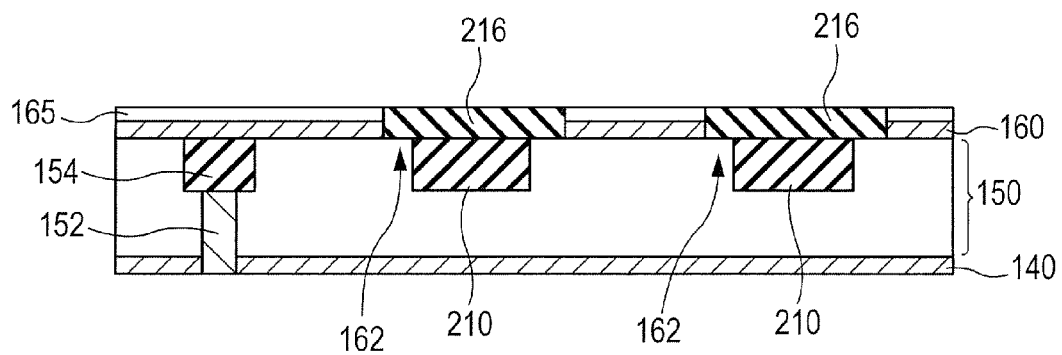

Subsequently, as shown in FIG. 28(b), the barrier metal films 216 are embedded into two openings 162. This process is also similar to that of the sixth embodiment. At this stage, the upper surface of two barrier metal films 216 forms the same plane as that of the upper surface of the protective insulating film 165.

Figure 29A:
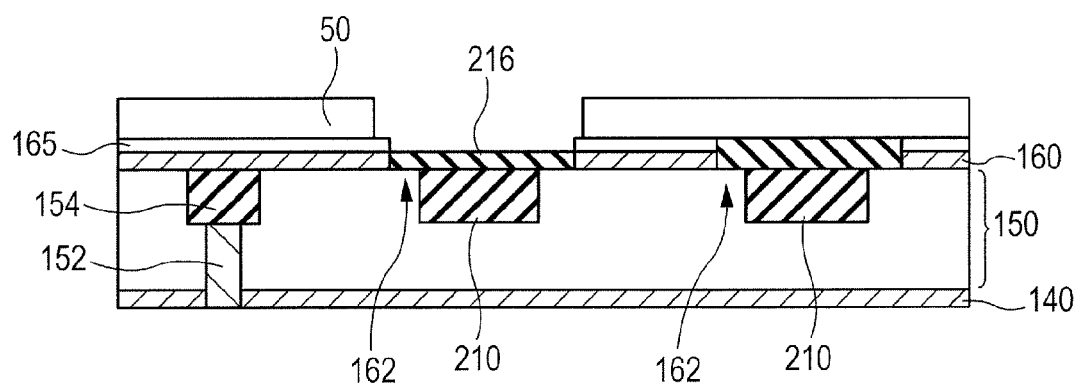
FIGS. 29(a) and 29(b) are cross-sectional views showing the method for manufacturing the semiconductor device of FIG. 27.

Subsequently, as shown in FIG. 29(a), a resist pattern 50 is formed over the protective insulating film 165 and the barrier metal film 216. The resist pattern 50 has an opening in the barrier metal film 216 in which the transistor 200 is formed. Subsequently, using the resist pattern 50 as a mask, an etch back of the barrier metal film 216 is performed. As a result, the upper surface of the barrier metal film 216 in which the transistor 200 is formed becomes lower than the upper surface of the protective insulating film 165.

Figure 29B:
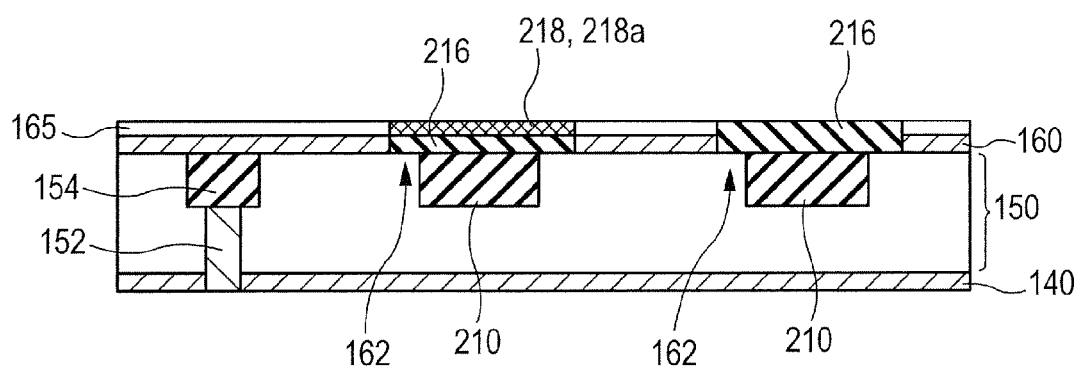

Then, as shown in FIG. 29(b), the resist pattern 50 is removed. Subsequently, the gate electrode 218 (218a) of the transistor 200 is embedded into the barrier metal film 216 in which the transistor 200 is formed. This process is the same as in the sixth embodiment.

Figure 30A:
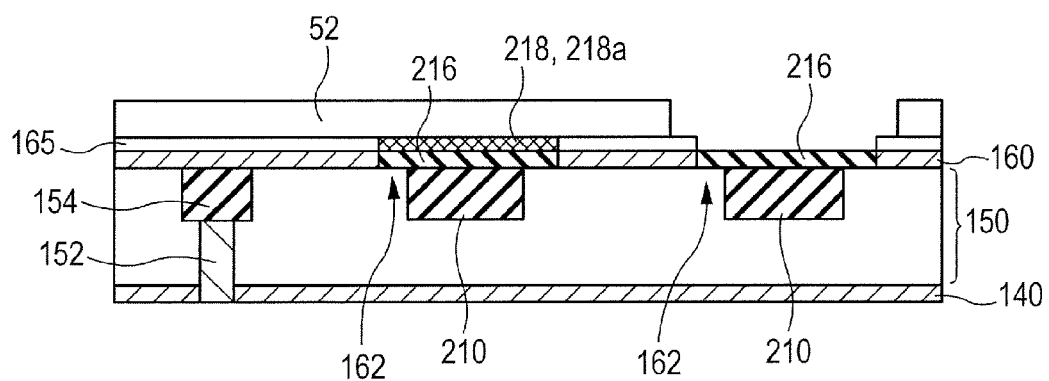
FIGS. 30(a) and 30(b) are cross-sectional views showing the method for manufacturing the semiconductor device of FIG. 27.

Subsequently, as shown in FIG. 30(a), a resist pattern 52 is formed over the protective insulating film 165, over the gate electrode 218 (218a) of the transistor 200, and over the barrier metal film 216 of the transistor 201. The resist pattern 52 has an opening in the barrier metal film 216 in which the transistor 201 is formed. Subsequently, using the resist pattern 52 as a mask, an etch back of the barrier metal film 216 is performed. As a result, the upper surface of the barrier metal film 216 in which the transistor 201 is formed becomes lower than the upper surface of the protective insulating film 165.

Figure 30B:
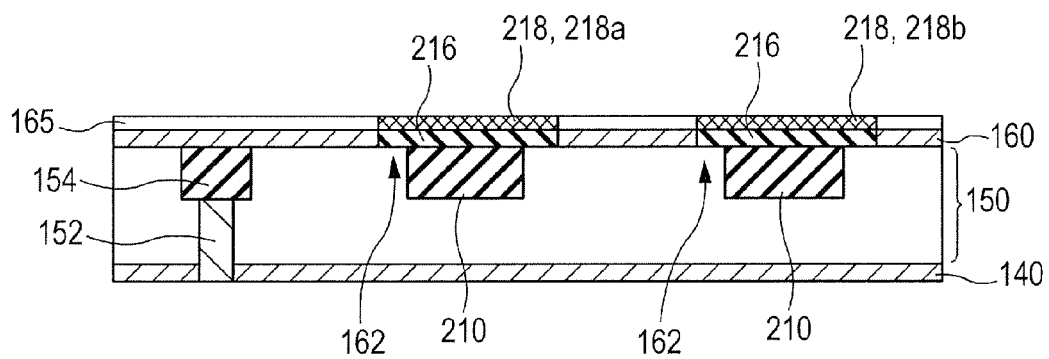

Then, as shown in FIG. 30(b), the resist pattern 52 is removed. Subsequently, the gate electrode 218 (218b) of the transistor 201 is embedded in the barrier metal film 216 in which the transistor 201 is formed. The gate electrode 218a of the transistor 200 and the gate electrode 218b of the transistor 201 may be formed using different materials. This process is similar to that of forming the gate electrode 218 (218a) of the transistor 200.

Figure 31A:
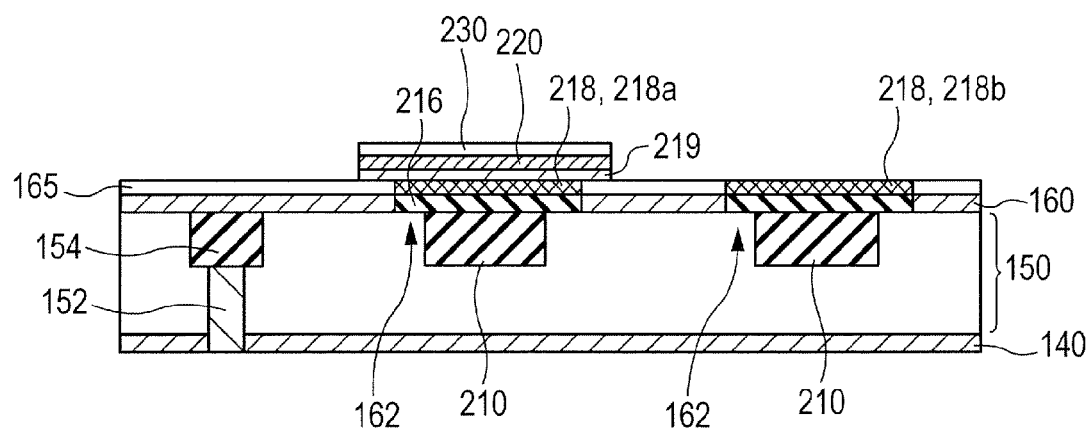
FIGS. 31(a) and 31(b) are cross-sectional views showing the method for manufacturing the semiconductor device of FIG. 27.

Subsequently, as shown in FIG. 31(a), there are formed a gate insulating film 219 configuring the transistor 200 and the semiconductor layer 220 over the diffusion prevention film 160 and the gate electrode 218 (218a). Subsequently, the hard mask film 230 which configures the transistor 200 is formed over the semiconductor layer 220. Subsequently, using the hard mask film 230 as a mask, etching of the semiconductor layer 220 and the gate insulating film 219 is performed. As a result, the gate insulating film 219 and the semiconductor layer 220 of the transistor 200 are formed.

Figure 31B:
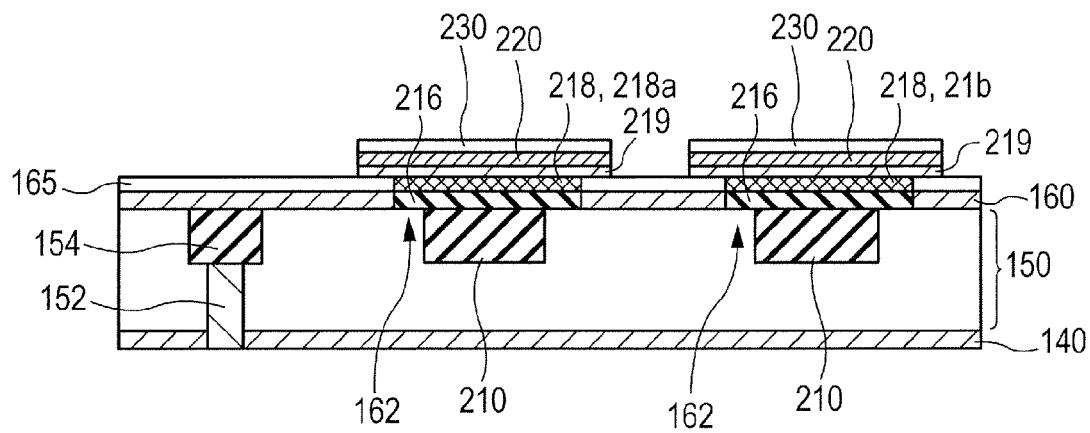

Subsequently, as shown in FIG. 31(b), over the diffusion prevention film and over the gate electrode 218 (218b) of the transistor 201, there are formed the gate insulating film 219 configuring the transistor 201 and the semiconductor layer 220. Subsequently, the hard mask film 230 which configures the transistor 201 is formed over the semiconductor layer 220. Subsequently, using the hard mask film 230 as a mask, etching of the semiconductor layer 220 and the gate insulating film 219 is performed. Thus, the gate insulating film 219 of the transistor 201 and the semiconductor layer 220 are formed.

Subsequent processes are similar to those of the sixth embodiment.

According to the present embodiment also, effects similar to those of the sixth embodiment can be obtained. In addition, the transistor 200 and transistor 201 having different properties can be formed in the same layer.

Further, each of the transistors 200 and 201 may have a similar configuration to any one of the first to third embodiments and the fifth embodiment.

Ninth Embodiment

FIGS. 32(a) and 32(b) to 34(a) and 34(b) are cross-sectional views showing a method of manufacturing a semiconductor device according to a ninth embodiment. The semiconductor device manufactured according to the present embodiment has a similar configuration to the semiconductor device shown in the eighth embodiment.

Figure 32A:
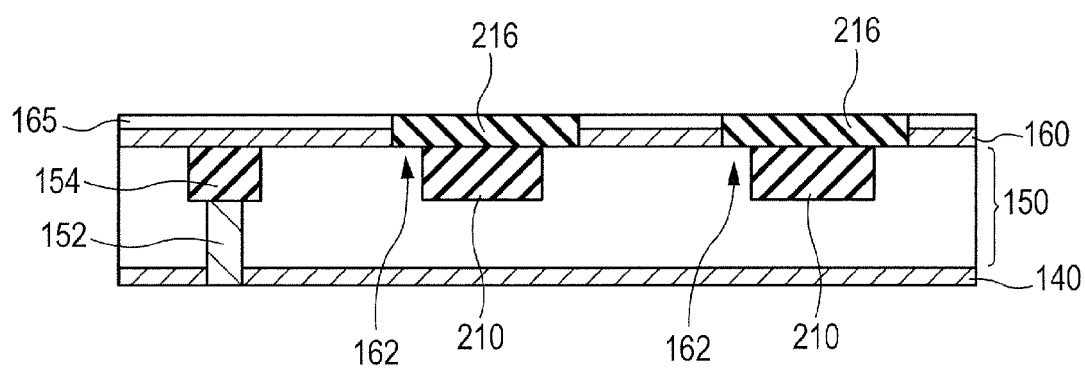
FIGS. 32(a) and 32(b) are cross-sectional views showing a method for manufacturing the semiconductor device according to a ninth embodiment.

First, as shown in FIG. 32(a), there are formed the diffusion prevention film 140, the first wiring layer 150, the via 152, the third wiring 154, the first wiring 210, the diffusion prevention film 160, and two openings 162. Further, barrier metal films 216 are embedded into the two openings 162, respectively. A method for forming these is similar to that of the eighth embodiment.

Figure 32B:
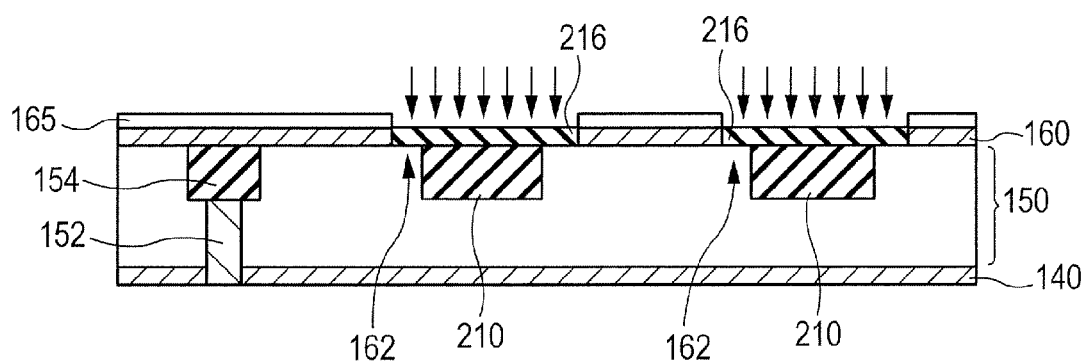

Subsequently, as shown in FIG. 32(b), etch back processes of the two barrier metal films 216 are performed simultaneously. Thus, either of the upper surfaces of the two barrier metal films 216 becomes lower than an upper surface of the protective insulating film 165.

Figure 33A:
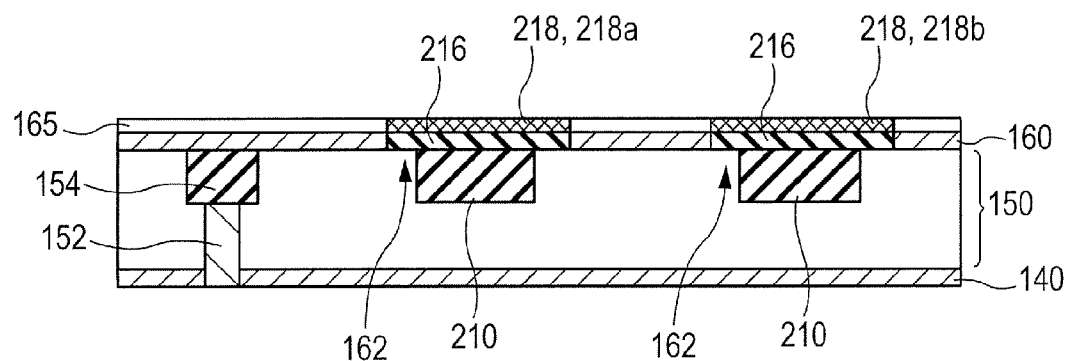
FIGS. 33(a) and 33(b) are cross-sectional views showing the method for manufacturing the semiconductor device according to the ninth embodiment.

Subsequently, as shown in FIG. 33(a), gate electrodes 218 (218a) are formed over the two barrier metal films 216 and over the protective insulating film 165. Subsequently, the gate electrode 218 (218a) located over the protective insulating film 165 is removed using the CMP method. Thus, the gate electrodes 218 (218a) are embedded into two openings 162, respectively.

Figure 33B:
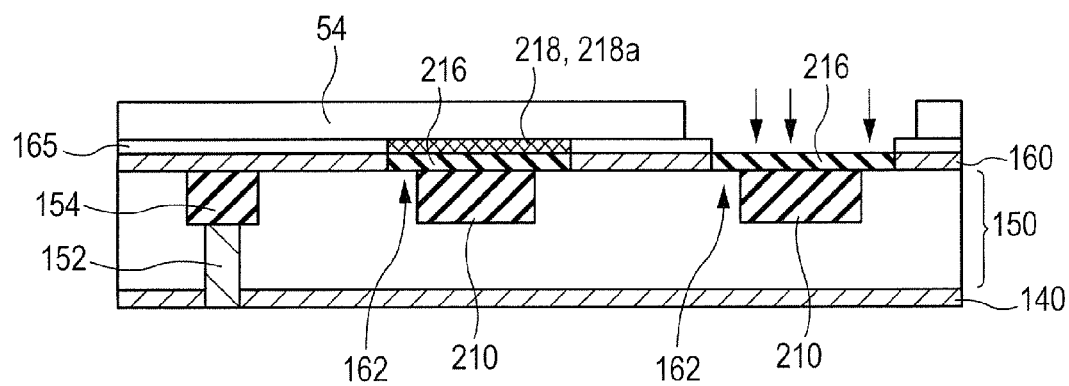

Subsequently, as shown in FIG. 33(b), the gate electrode 218 (218a) forming the transistor 200 is covered with a resist pattern 54. However, the resist pattern 54 is not formed over the barrier metal film 216 to be the transistor 201. Subsequently, using the resist pattern 54 as a mask, the gate electrode 218 (218a), formed over the barrier metal film 216, to be the transistor 201 is removed by etching.

Figure 34A:
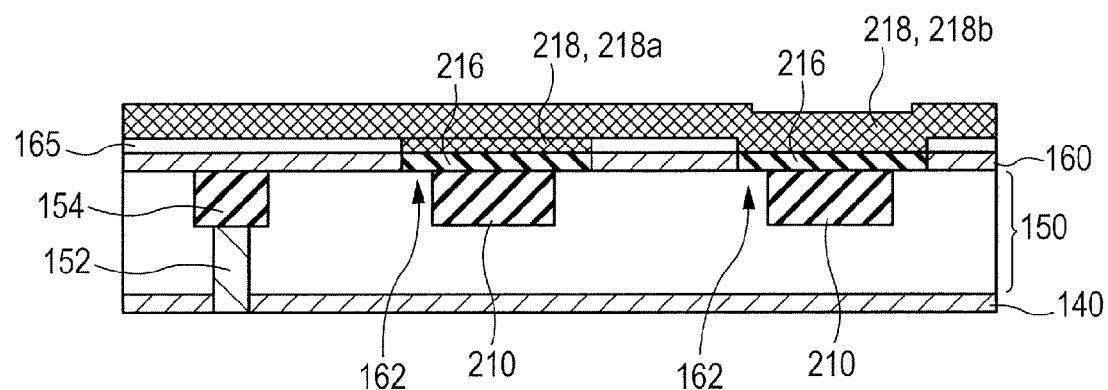
FIGS. 34(a) and 34(b) are cross-sectional views showing the method for manufacturing the semiconductor device according to the ninth embodiment.
Figure 34B:
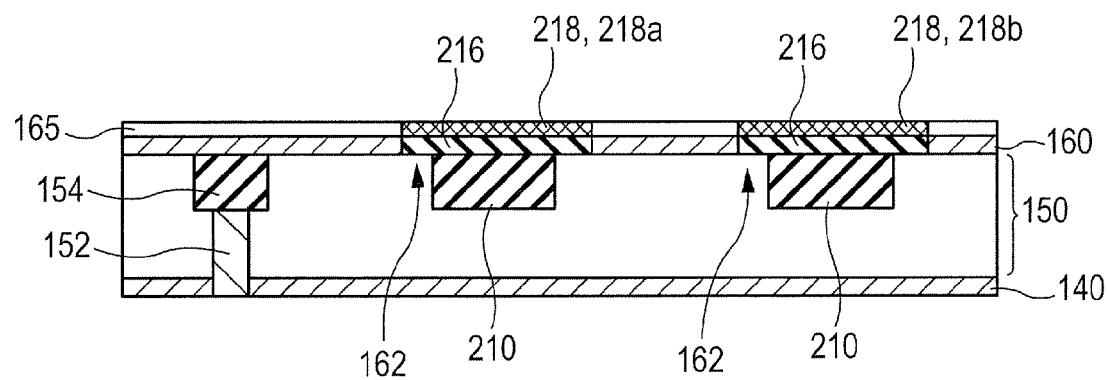

Subsequently, as shown in FIG. 34(a), the gate electrodes 218 (218b) are formed over the barrier metal film 216 to be the transistor 201, over the protective insulating film 165, and over the gate electrode 218 (218a) of the transistor 200. Subsequently, as shown in FIG. 34(b), the gate electrode 218 (218b) located over the protective insulating film 165 and over the gate electrode 218 (218a) of the transistor 200 are removed by the CMP method.

Thus, the barrier metal film 216 and the gate electrode 218 (218a) are embedded into the openings 162 to be the transistor 200, and the barrier metal film 216 and the gate electrode 218 (218b) are embedded into the openings 162 to be the transistor 201. Subsequent processes are similar to those of the eighth embodiment.

According to the present embodiment also, effects similar to those of the eighth embodiment can be obtained. Moreover, as compared to the eighth embodiment, the number of times of forming resist patterns can be reduced. Therefore, the number of processes for manufacturing the semiconductor device can be reduced.

Tenth Embodiment

Figure 35:
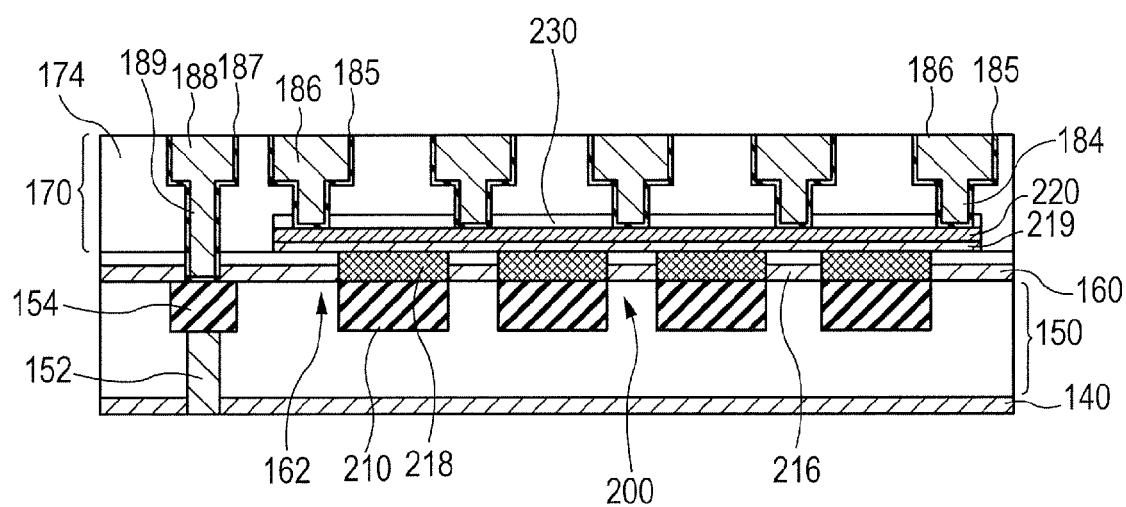
FIG. 35 is a cross-sectional view showing a configuration of a semiconductor device according to a tenth embodiment.
Figure 36:
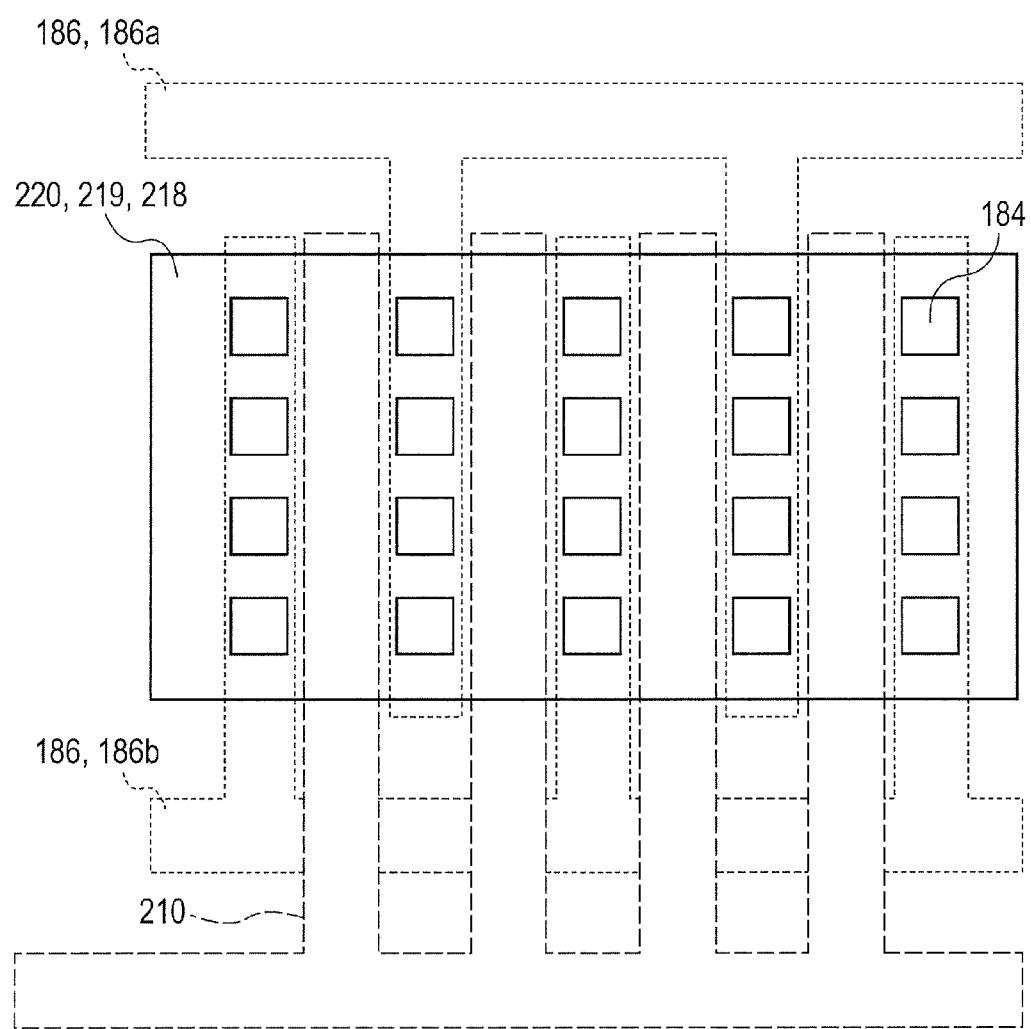
FIG. 36 is a plan view of the semiconductor device shown in FIG. 35.

FIG. 35 is a cross-sectional view showing a configuration of a semiconductor device according a tenth embodiment. FIG. 36 is a plan view of the semiconductor device shown in FIG. 35. In the semiconductor device, a stacked structure of each layer which configures the transistor 200 is the same as that of the third embodiment. However, the gate electrode 218 is comb-shaped in a plan view. Then, of the semiconductor layer 220, over a portion sandwiched by the gate electrode 218, there are extending alternately a second wiring 186 (186b) to be a source wiring, and a second wiring 186 (186a) to be a drain wiring. Further, two or more first vias 184 are formed for each second wiring 186. Each of the two second wirings 186 is also comb-shaped in a plan view. That is, the transistor 200 according to the present embodiment is comb-shaped in a plan view.

According to the present embodiment also, effects similar to those of the third embodiment can be obtained. Moreover, since the transistor 200 is comb-shaped in a plan view, a wider practical channel width can be secured. Therefore, an on-state current of the transistor 200 can be increased.

Further, in the present embodiment, a stacked structure of each layer which configures the transistor 200 may be any one of the structures shown in the first to second embodiments and the fourth to sixth embodiments.

Eleventh Embodiment

Figure 37:
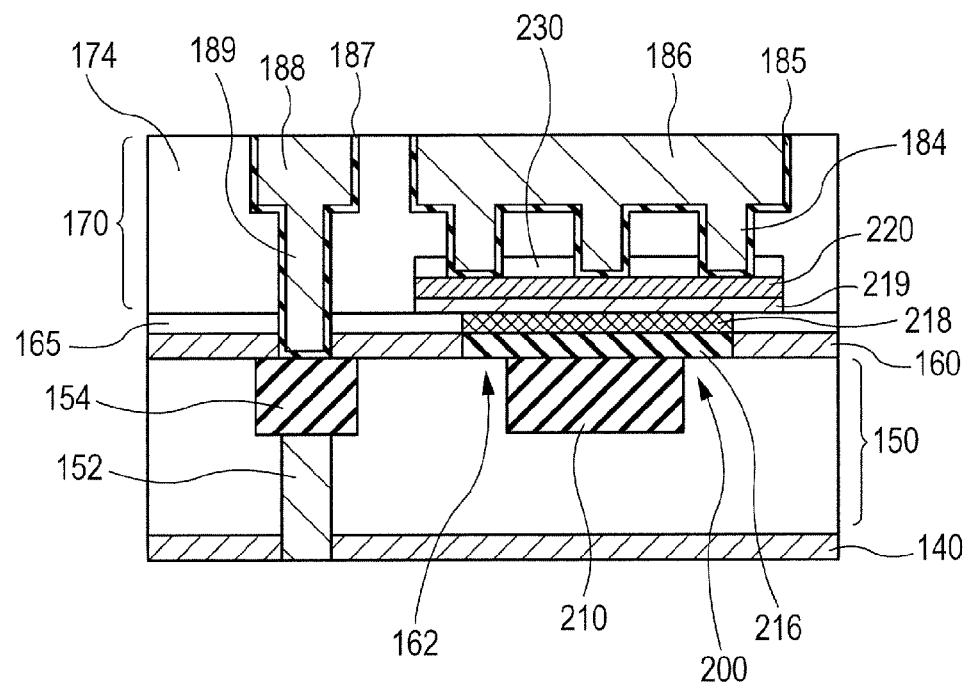
FIG. 37 is a cross-sectional view showing a configuration of a semiconductor device according to an eleventh embodiment.

FIG. 37 is a cross-sectional view showing a configuration of a semiconductor device according an eleventh embodiment. The semiconductor device of the present embodiment has a similar configuration to the semiconductor device according to the fifth embodiment, except in that the semiconductor device has a capacitance element 202 in place of the transistor 200.

The capacitance element 202 is an MIS type capacitance element, and is configured such that first vias 184 coupled a source, a channel region, and a drain of the transistor 200, respectively, are coupled to the same second wiring 186. For this reason, the capacitance element 202 can be formed by the same method as in the case of the transistor 200.

According to the present embodiment, the MIS type capacitance element 202 can be formed in a multi-layer wiring layer. Further, the transistor 200 shown in the fifth embodiment and the capacitance element 202 according to the present embodiment can be formed in the same layer by the same process.

According to the present embodiment, the stacked structure of each layer which configures the capacitance element 202 may be anyone of the structures shown in the first to fourth embodiments and the sixth embodiment.

Twelfth Embodiment

Figure 38:
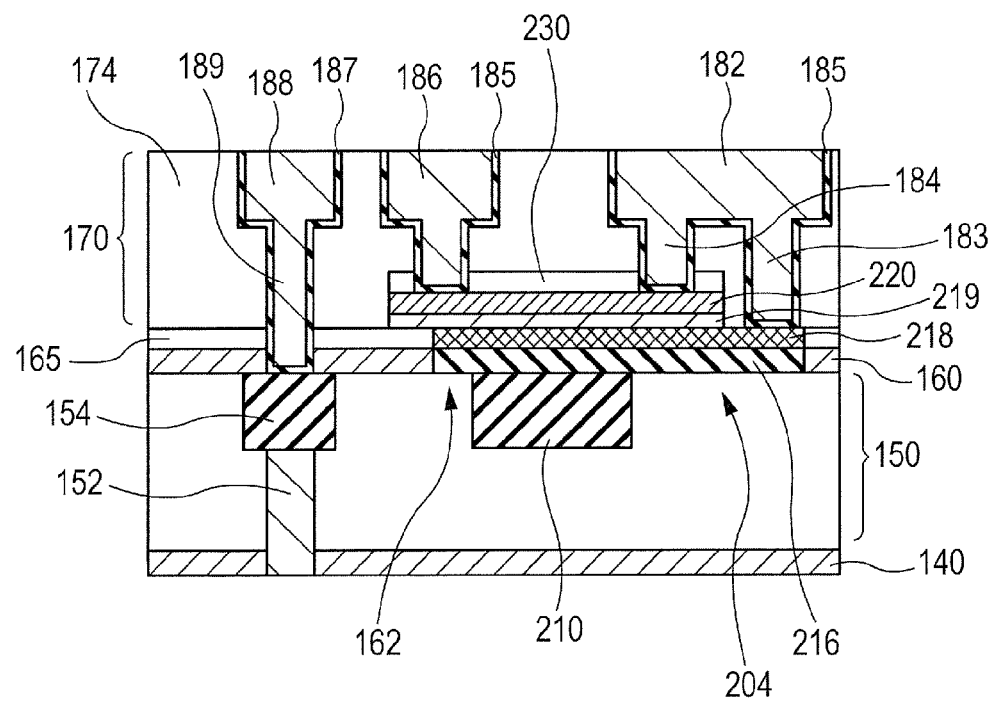
FIG. 38 is a cross-sectional view showing a configuration of a semiconductor device according to a twelfth embodiment.

FIG. 38 is a cross-sectional view showing a configuration of a semiconductor device according to a twelfth embodiment. The semiconductor device has a similar configuration to the semiconductor device according to the fifth embodiment, except in that the semiconductor has a diode 204 in place of the transistor 200.

The diode 204 has a configuration in which the gate electrode 218 of the transistor 200 in the fifth embodiment is shorted with the wiring 182 coupled to a source of the semiconductor layer 220 through a via 183. The via 183 is formed by the same process as in the case of the via 181. That is, the vias 181,183 and the wiring 182 have the dual damascene structure.

According to the present embodiment, the diode 204 can be formed in the multi-layer wiring layer. Further, it becomes possible to form at least one of the transistor 200 shown in the fifth embodiment and the capacitance element 202 shown in the eleventh embodiment, and the diode 204 according to the present embodiment 204 are formed in the same layer by the same process.

Also, in the present embodiment, the stacked structure of each layer which configures the diode 204 may be a structure shown in any one of the first to fourth and the sixth embodiments.

Thirteenth Embodiment

Figure 39:
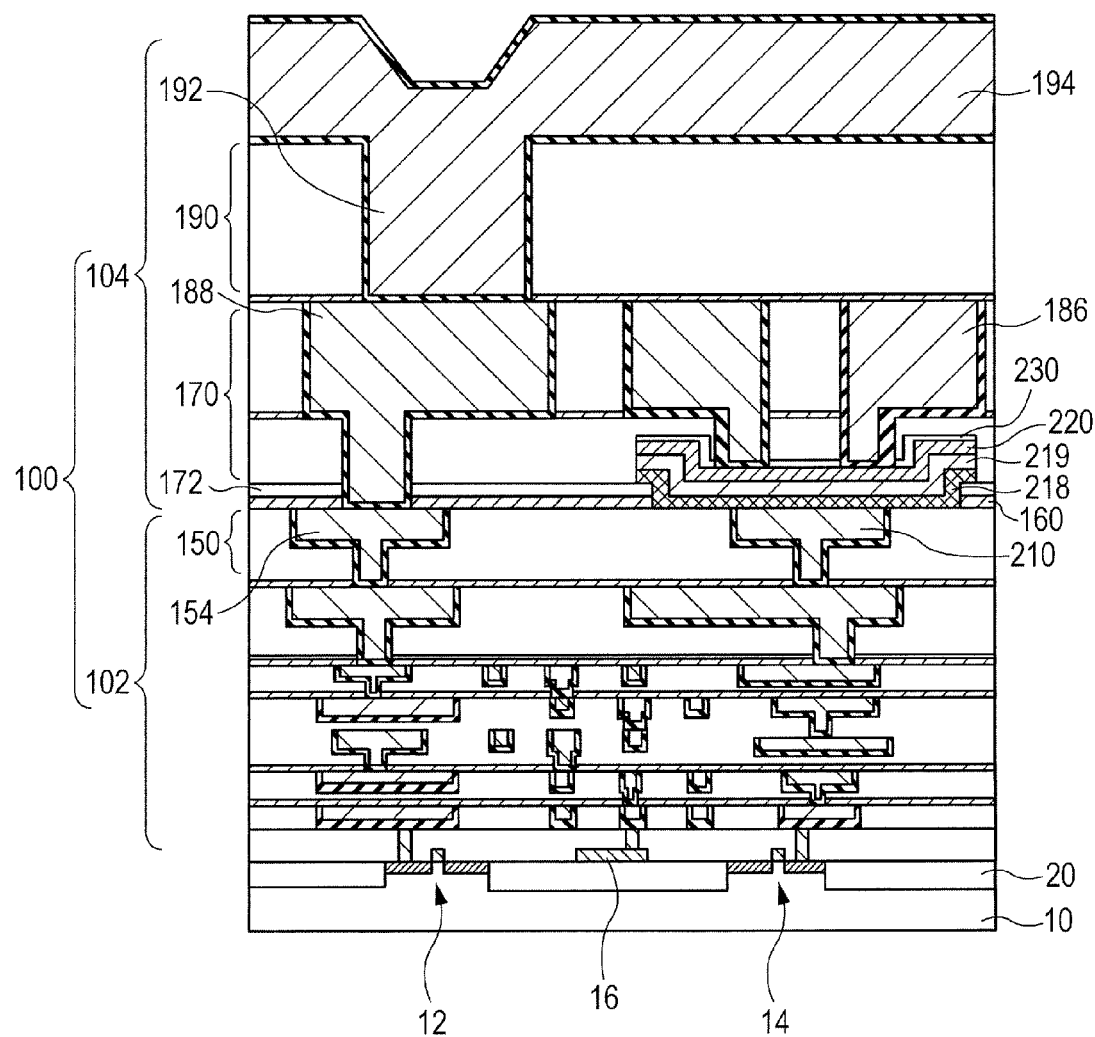
FIG. 39 is a cross-sectional view showing a configuration of a semiconductor device according to a thirteenth embodiment.

FIG. 39 is a cross-sectional view showing a configuration of a semiconductor device according to a thirteenth embodiment. The semiconductor device includes a semiconductor substrate 10 and a multi-layer wiring layer 100.

Over the semiconductor substrate 10, there are formed an element isolation film 20 and transistors 12 and 14 (first transistors). Furthermore, on the element isolation film 20, a passive element (for example, a resistive element) 16 is formed. The passive element 16 is formed by the same process as that of the gate electrode of the transistor 12.

In the multi-layer wiring layer 100, at least one of the transistor 200 shown in the first to sixth embodiments, the passive element 202 shown in the eleventh embodiment, and the diode 204 shown in the twelfth embodiment are formed. In an example shown in FIG. 39, the transistor 200 shown in the first embodiment (FIG. 1) is formed. The transistor 200 in a plan view is larger than the transistors 12 and 14 in size. Though not shown, the semiconductor device has the diode 204 in the same layer as that of the transistor 200.

In the example shown in FIG. 39, a first wiring layer 150 is located in an uppermost layer of a local wiring layer 102 which is a wiring layer where a circuit is formed. Further, the second wiring layer 170 is located in the lowest layer of a global wiring layer 104 which is a wiring for laying a power supply wiring and a ground wiring. Also, over the second wiring layer 170, a wiring 194 is formed through an interlayer insulating film 190. The wiring 194 is an Al wiring and is coupled to a wiring (for example, a fourth wiring 188) of the second wiring layer 170 through a via 192. The wiring 194 has barrier metal films formed over its upper and lower surfaces. The barrier metal film is a metal film containing Ti as a principal component, a nitride film of the metal, or a stacked structure of the metal film and the nitride film. In addition, in the same layer as that of the wiring 194, electrode pads (a power supply pad 400, a ground pad 402, and an I/O pad 410 for signals to be described later) are formed.

In addition, each wiring layer which configures the local wiring layer 102 is thinner than each wiring layer which configures the global wiring layer 104. Each wiring of the local wiring layer 102 is also thinner than each wiring of the global wiring layer 104.

A drain (or a source) of a transistor 12 is coupled to the third wiring 154 through a wiring and a via formed in the local wiring layer 102. A drain of the transistor 14 is coupled to the gate electrode 218 through the wiring and the via which are formed in the local wiring layer 102. Transistors 12 and 14 configure internal circuits 300 and 302 to be described later. In addition, the transistor 14 is overlapped with the semiconductor layer 220 of the transistor 200 in a plan view.

Figure 40:
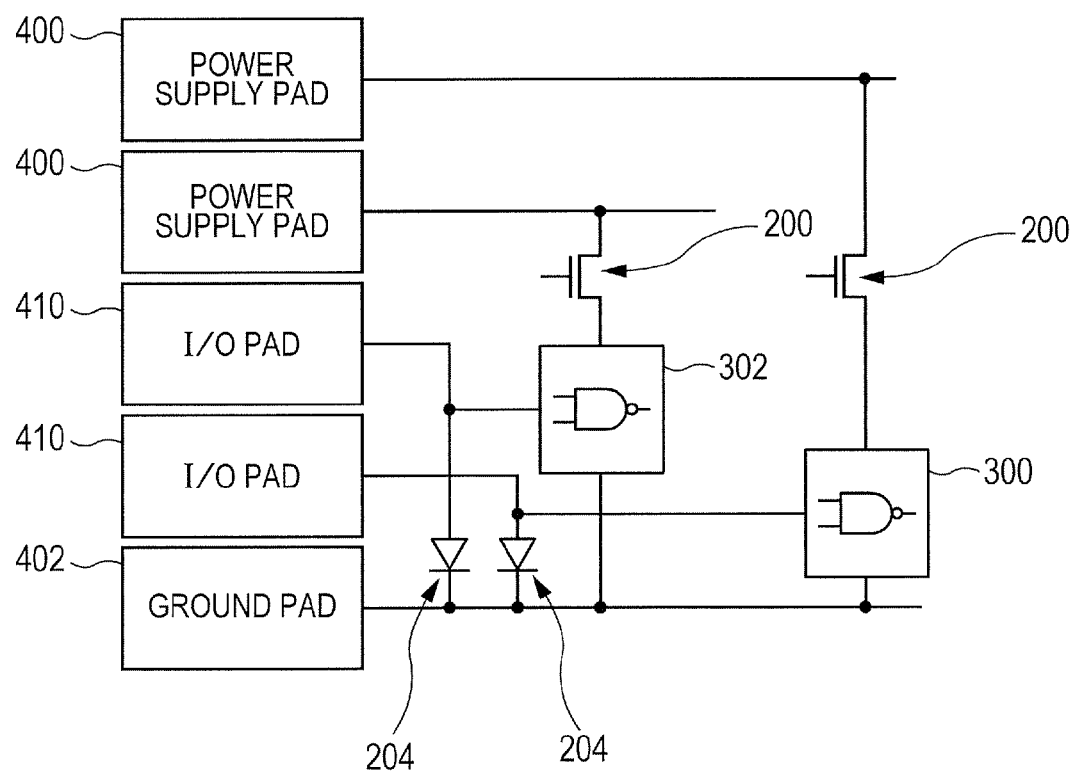
FIG. 40 is a circuit diagram of the semiconductor device shown in FIG. 39.

FIG. 40 is a circuit diagram of the semiconductor device shown in FIG. 39. In the present embodiment, the semiconductor device has the power supply pad 400, the ground pad 402, and the I/O pads 410. The power supply pad 400 is a pad for supplying a power supply voltage (Vdd) to the semiconductor device, and the ground pad 402 is a pad for supplying a ground potential to the semiconductor device. The I/O pad 410 is a pad for outputting and inputting signals to and from the semiconductor device.

The internal circuits 300 and 302 are formed in the semiconductor device. Either of the internal circuit 300 and the internal circuit 302 is coupled to the power supply pad 400 through the transistor 200. That is, the transistor 200 configures part of the power supply circuit. According to the present embodiment, different power supply voltages are supplied to the internal circuits 300 and 302. Therefore, the internal circuits 300 and 302 are coupled to different power supply pads 400 through the different transistors 200.

Moreover, the internal circuits 300 and 302 are coupled to the I/O pad 410, and output and input signals to and from the external device through the I/O pad 410. Either of the internal circuits 300 and 302 is coupled to the ground pad 402. The diode 204 is provided between the I/O pad 410 and the ground pad 402 such that a direction from the I/O pad 410 toward the ground pad 402 is a forward direction. That is, the diodes 204 are protection elements for protecting the internal circuit 300 from the ESD etc. and are coupled in parallel to the internal circuit 300.

Figure 41:
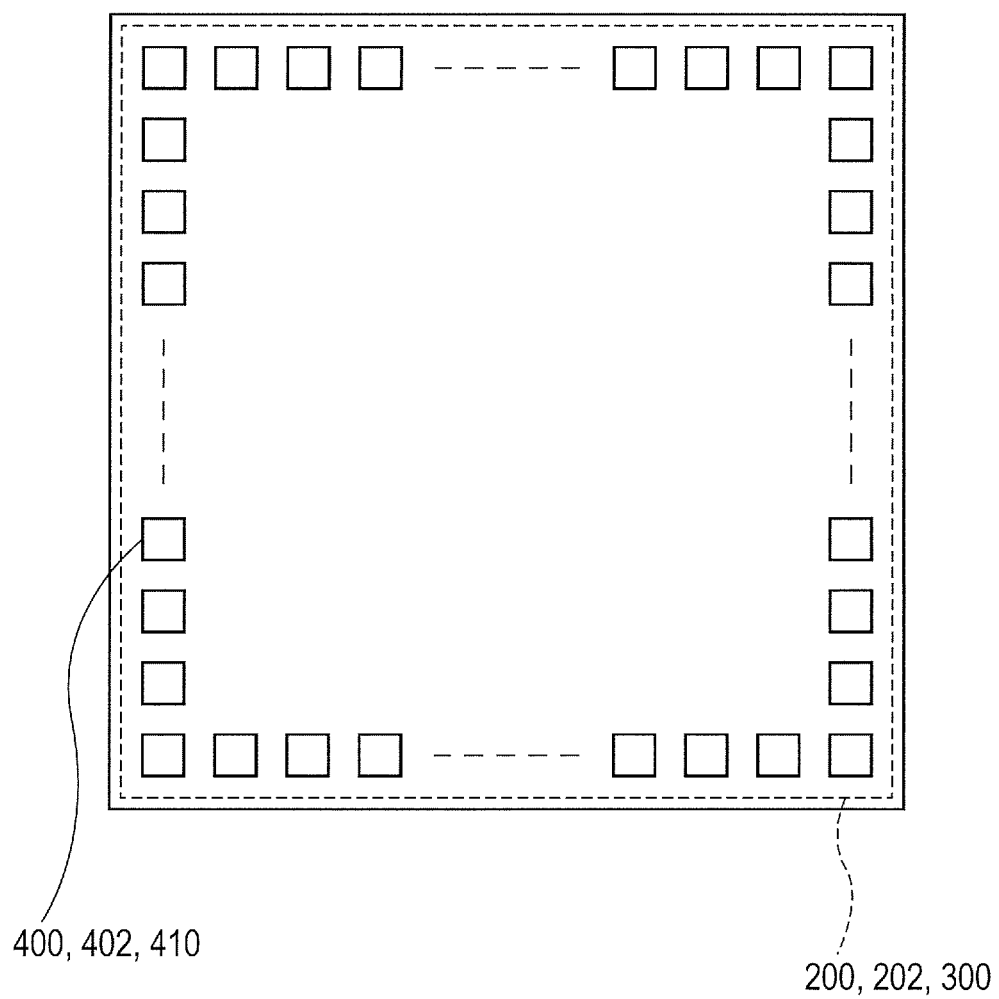
FIG. 41 is a plan view showing an overall configuration of the semiconductor device shown in FIGS. 39 and 40.

FIG. 41 is a plan view showing an overall configuration of the semiconductor device shown in FIGS. 39 and 40. As shown in FIG. 41, the semiconductor device is rectangular. Further, along sides thereof, two or more power supply pads are arranged. The power supply pads are any of the power supply pad 400, the ground pad 402, and the I/O pad 410.

Moreover, in a plan view, a region in which the internal circuit 300, the transistor 200, and the capacitance element 202 are formed includes, inside, a region surrounded by the power supply pad 400, the ground pad 402, and the I/O pad 410. That is, the power supply pad 400, the ground pad 402, and the I/O pad 410 are overlapped with the internal circuit 300, the transistor 200, and the capacitance element 202.

Figure 42:
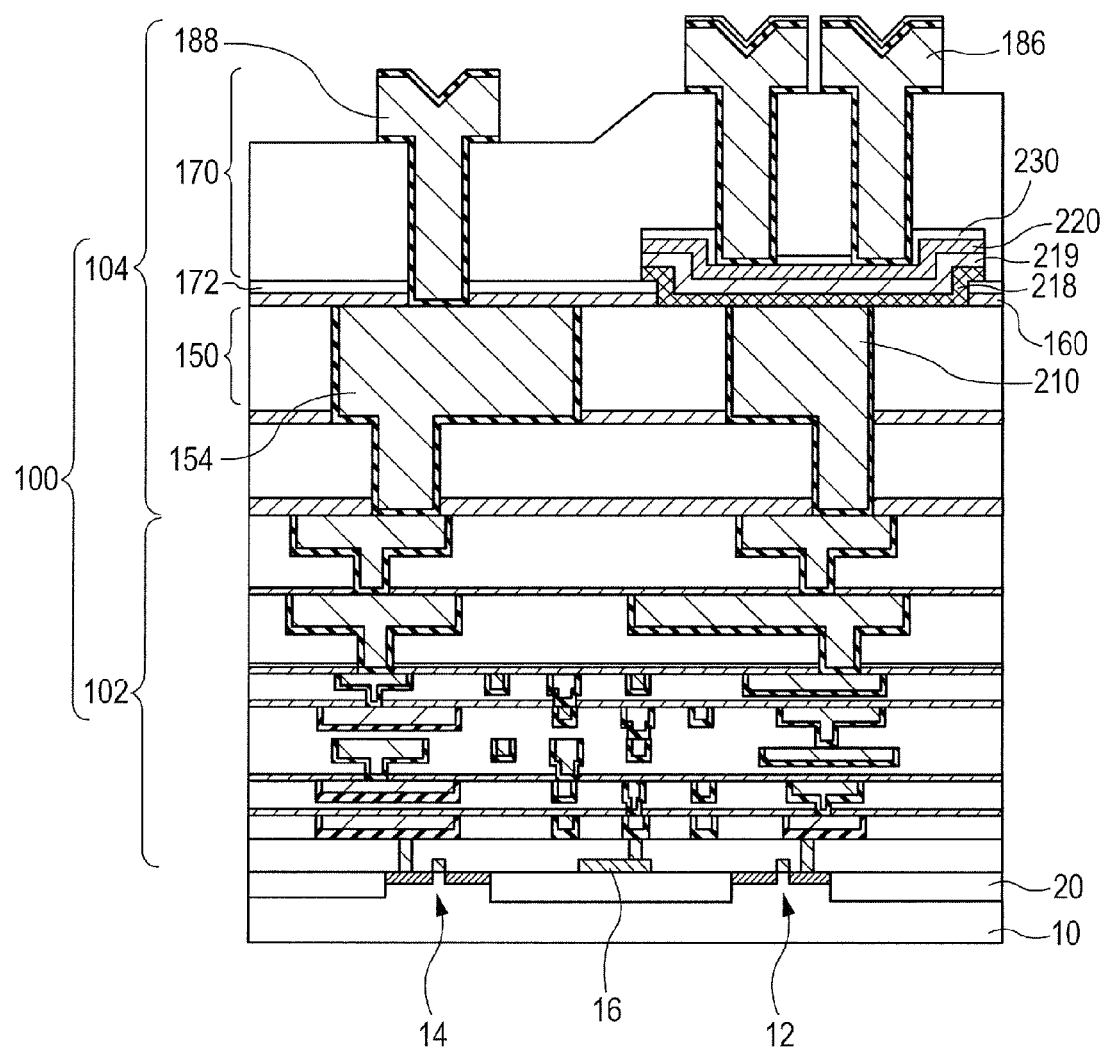
FIG. 42 is a diagram showing a modification of the semiconductor device of FIG. 39.

FIG. 42 shows a modification of the example shown in FIG. 39. In FIG. 42, the first wiring layer 150 and the second wiring layer 170 are both formed in the global wiring layer 104. Further, the fourth wiring 188 and the second wiring 186 include an Al wiring. The power supply pad 400, the ground pad 402, and the I/O pad 410 are formed in the same layer as that of the second wirings 186 and 188.

According to the present embodiment, the transistors configure power supply circuits of the internal circuits 300 and 302. Further, the diode 204 is used as the protective element for the internal circuits 300 and 302. Therefore, the internal circuits 300 and 302 can be overlapped with the power supply circuits and the protection element in a plan view. Therefore, the semiconductor device can further be reduced in size.

While the embodiments of the present invention have been described with reference to the drawings, the foregoing descriptions are in all aspect illustrative and not restrictive. It is therefore understood that numerous modifications and variations can be devised without departing from the scope of the invention.

What is claimed is:

1. A semiconductor device comprising:
a first wiring layer having a first wiring;
a second wiring layer formed over the first wiring layer and having a second wiring;
a third wiring formed in the first wiring layer;
a fourth wiring formed in the second wiring layer;
a gate electrode located between the first wiring and the second wiring in a thickness direction, containing a material different from that of the first wiring, and coupled to the first wiring;
a gate insulating film located over the gate electrode;
a semiconductor layer located over the gate insulating film;
a first via embedded into the second wiring layer and coupling the semiconductor layer with the second wiring; and
a second via embedded into the second wiring layer and coupling the third wiring with the fourth wiring.

2. The semiconductor device according to claim 1,
wherein the third wiring has a configuration similar to that of the first wiring,
wherein the fourth wiring has a configuration similar to that of the second wiring, and
wherein the second via has a configuration similar to that of the first via.

3. The semiconductor device according to claim 1, wherein the gate electrode, the gate insulating film, and the semiconductor layer form a capacitance element.

4. The semiconductor device according to claim 1,
wherein the first wiring is a Cu wiring, and
wherein the gate electrode comprises Ti, Ta, W, TiN, TaN, WN films, a compound containing Co or W, a film made by introducing at least one of C and O to one of the above, or a stacked film made by stacking two or more kinds of these films.

5. The semiconductor device according to claim 1, wherein the gate insulating film includes a silicon oxide film, a silicon nitride film, or an oxide film having at least one of Hf, Zr, Al, Ti, and Ta.

6. The semiconductor device according to claim 1, wherein the semiconductor layer is an oxide semiconductor layer.

7. The semiconductor device according to claim 6, wherein the oxide semiconductor layer is an InGaZnO layer, an InZnO layer, a ZnO layer, a ZnAlO layer, a ZnCuO layer, an NiO layer, an $NiO_2$ layer, an SnO layer, or a CuO layer.

8. The semiconductor device according to claim 1,
wherein the first wiring layer and the second wiring layer are formed over a substrate, and
wherein the semiconductor device comprises a first transistor formed over the substrate.

9. The semiconductor device according to claim 8, wherein the first transistor is overlapped with the semiconductor layer in a plan view.

10. The semiconductor device according to claim 1,
wherein the semiconductor layer has a source and a drain,
wherein the source is shorted with the gate electrode, and
wherein the source, the drain, the gate insulating film, and the gate electrode form a diode.

11. The semiconductor device according to claim 10, comprising:
an internal circuit;
an I/O pad formed in an uppermost layer of the multi-layer wiring layer and supplying signals to the internal circuit; and
a ground pad formed in the uppermost wiring layer and supplying a ground potential to the internal circuit,
wherein the diode is provided between the I/O pad and the ground pad such that a direction from the I/O pad toward the ground pad is a forward direction.

12. The semiconductor device according to claim 1, comprising:
a diffusion prevention film formed over the first wiring layer;
an opening formed in the diffusion prevention film and located over the first wiring; and
a barrier metal film located inside the opening and coupling the gate electrode with the first wiring.

13. The semiconductor device according to claim 12, comprising a protective insulating film located over the diffusion prevention film,
wherein the openings are formed in the protective insulating film and the diffusion prevention film.

14. The semiconductor device according to claim 13, wherein the protective insulating film is formed using a material whose dielectric constant is lower than that of a silicon oxide or formed of a porous film of such a material.

15. The semiconductor device according to claim 1, comprising:
a diffusion prevention film formed between the first wiring layer and the second wiring layer; and
an opening formed in the diffusion prevention film and located over the first wiring,
wherein the gate electrode is formed at least inside the opening.

16. The semiconductor device according to claim 15, wherein the gate electrodes are formed inside the opening and over the diffusion prevention film located around the opening.

17. The semiconductor device according to claim 15, comprising a barrier metal film located inside the opening and coupling the gate electrode with the first wiring.

18. The semiconductor device according to claim 15, wherein the gate electrode is located only inside the opening.

19. The semiconductor device according to claim 18, wherein an upper surface of the gate electrode and an upper surface of the diffusion prevention film form the same plane.

20. The semiconductor device according to claim 1, comprising two second wirings and two first vias,
wherein the two second wirings are coupled to the semiconductor layer through the first vias which are different from each other, and
wherein the two first vias are disposed on the opposite sides from each other through the center of the gate electrode in a plan view.

21. The semiconductor device according to claim 20,
wherein the semiconductor layer is larger than the gate electrode in a plan view, and
wherein the center of the two first vias is not overlapped with the gate electrode.

22. The semiconductor device according to claim 20, wherein the gate electrode, the gate insulating film, and the semiconductor layer form a second transistor.

23. The semiconductor device according to claim 22, comprising:
an internal circuit; and
a power supply pad formed in an uppermost wiring layer of the multi-layer wiring layer and supplying a power supply voltage to the internal circuit,
wherein the internal circuit is coupled to the power supply pad through the second transistor.

24. The semiconductor device according to claim 22, comprising at least the two second transistors,
wherein at least the two transistors have different combinations of materials for the gate electrode, the gate insulating film, and the semiconductor layer.

25. The semiconductor device according to claim 24, wherein at least the two second transistors have the same electric conductive types of channels and have different threshold voltages from each other.

26. The semiconductor device according to claim 1, comprising a hard mask film formed over the semiconductor layer and having the same planar shape as that of the semiconductor layer.

27. The semiconductor device according to claim 26, wherein the hard mask film is comprised of the same material as that of the diffusion prevention film and has a layer having the same thickness as that of the diffusion prevention film.

* * * * *